US010818800B2

(12) United States Patent
Hsieh et al.

(10) Patent No.: US 10,818,800 B2
(45) Date of Patent: Oct. 27, 2020

(54) SEMICONDUCTOR STRUCTURE AND METHOD FOR PREPARING THE SAME

(71) Applicant: NANYA TECHNOLOGY CORPORATION, New Taipei (TW)

(72) Inventors: Cheng-Hsien Hsieh, New Taipei (TW);
Tseng-Fu Lu, New Taipei (TW);
Jhen-Yu Tsai, Kaohsiung (TW);
Ching-Chia Huang, Taipei (TW);
Wei-Ming Liao, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/894,580

(22) Filed: Feb. 12, 2018

(65) Prior Publication Data

US 2019/0198676 A1 Jun. 27, 2019

Related U.S. Application Data

(60) Provisional application No. 62/609,999, filed on Dec. 22, 2017.

(51) Int. Cl.
*H01L 29/786* (2006.01)
*H01L 29/66* (2006.01)
*H01L 29/423* (2006.01)
*H01L 29/49* (2006.01)
*H01L 29/78* (2006.01)

(52) U.S. Cl.
CPC .... *H01L 29/78648* (2013.01); *H01L 29/4236* (2013.01); *H01L 29/42392* (2013.01); *H01L 29/4908* (2013.01); *H01L 29/66484* (2013.01); *H01L 29/78* (2013.01); *H01L 29/78696* (2013.01); *H01L 29/7831* (2013.01)

(58) Field of Classification Search
None
See application file for complete search history.

(56) References Cited

U.S. PATENT DOCUMENTS 8,481,385 B2   7/2013   Gordon et al.
9,837,414 B1 * 12/2017   Balakrishnan ...... H01L 29/1083
(Continued)

FOREIGN PATENT DOCUMENTS

| TW | 201403813 A | 1/2014 |
|---|---|---|
| TW | 201507154 A | 2/2015 |
| TW | I587483 B | 6/2017 |

OTHER PUBLICATIONS

Huang, Rei-Fu, et al., Alternate hammering test for application-specific DRAMs and an industrial case study, Proceedings of the 49th Annual Design Automation Conference, ACM, Jun. 3-7, 2012. p. 1012-1017, San Francisco, California.
(Continued)

*Primary Examiner* — Nilufa Rahim
(74) *Attorney, Agent, or Firm* — Muncy, Geissler, Olds & Lowe, PC

(57) ABSTRACT

The present disclosure provides a semiconductor structure including a substrate, a bottom gate portion disposed in the substrate, a top gate portion stacked over the bottom gate portion, a first channel layer sandwiched between the top gate portion and the bottom gate portion, and a source/drain region disposed in the substrate at two opposite sides of the top gate portion.

14 Claims, 27 Drawing Sheets

(56) References Cited

U.S. PATENT DOCUMENTS

2016/0365440 A1* 12/2016 Suk ...................... H01L 29/785
2017/0256609 A1*  9/2017 Bhuwalka ........... H01L 29/0665

OTHER PUBLICATIONS

Office Action dated Dec. 9, 2019 related to Taiwanese Application No. 107112106.
Office Action issued in corresponding TW application No. 107112106 dated Jun. 8, 2020 (with English Translation).

* cited by examiner

SEMICONDUCTOR STRUCTURE AND METHOD FOR PREPARING THE SAME

PRIORITY DATA

This patent claims the benefit of U.S. Provisional Patent Application Ser. No. 62/609,999 filed Dec. 22, 2017, the entire disclosure of which is hereby incorporated by reference.

TECHNICAL FIELD

The present disclosure relates to a semiconductor structure and a method for preparing the same, and more particularly, to a semiconductor structure for a memory device and a method for preparing the same.

DISCUSSION OF THE BACKGROUND

Electrical products are becoming lighter, thinner, shorter, and smaller, and DRAMs are being scaled down to match the trends of high integration and high density. A DRAM including many memory cells is one of the most popular volatile memory devices utilized today. Each memory cell includes a transistor and at least a capacitor, wherein the transistor and the capacitor form a series connection with each other. The memory cells are arranged into memory arrays. The memory cells are addressed via a word line and a digit line (or bit line), one of which addresses a column of memory cells while the other addresses a row of memory cells. Using the word line and the digit line, a DRAM cell can be read and programmed.

A DRAM device requires, a higher drain saturation current ($I_{dsat}$) for faster charging and a lower off-leakage current ($I_{doff}$) for lower power consumption. Therefore, with the continuing reduction of the device size, it becomes an important issue to increase $I_{dsat}$ and reduce $I_{doff}$ in order to achieve a smaller memory cell layout.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a semiconductor structure. The semiconductor structure includes a substrate, a bottom gate portion disposed in the substrate, a top gate portion stacked over the bottom gate portion, a first channel layer sandwiched between the top gate portion and the bottom gate portion, and a source drain region disposed in the substrate at two opposite sides of the top gate portion.

In some embodiments, die bottom gate portion includes a bottom gate conductive layer and a bottom gate dielectric layer. In some embodiments, the bottom gate conductive layer is separated from the substrate and the first channel layer by the bottom gate dielectric layer.

In some embodiments, the top gale portion includes a lop gale conductive layer and a top gate dielectric layer. In some embodiments, the top gate conductive layer is separated from the substrate and the first channel layer by the lop gate dielectric layer.

In some embodiments, a width of the first channel layer is equal to or less than a width of the top gate portion, and a width of the bottom gate portion is equal to or less than the width of the first channel layer.

In some embodiments, the top gate portion overlaps the entire first channel layer. In some embodiments, the first channel layer overlaps the entire bottom gate portion.

In some embodiments, the first channel layer includes an epitaxial semiconductor material.

In some embodiments, a bottom surface of the source/drain region is higher than or substantially level with a bottom surface of the top gate portion.

In some embodiments, the bottom gate portion and the top gate portion are electrically connected.

In some embodiments, the first channel layer includes a plurality of nanowires.

In some embodiments, the semiconductor structure further includes at least one second channel layer disposed between the first channel layer and the top gate portion, and at least one middle gate portion sandwiched between the first channel layer and the second channel layer.

In some embodiments, the bottom gate portion, the top gate portion and the middle gate portion are electrically connected.

In some embodiments, die middle gate portion includes a middle gate dielectric layer and a middle gate conductive layer. In some embodiments, the middle gate conductive layer is separated from the substrate, the first channel layer and the second channel layer by the middle gate dielectric layer.

In some embodiments, a width of the top gate portion is greater than a width of the middle gate portion, and the width of the middle gate portion is greater than a width of the bottom gate portion.

In some embodiments, the middle gate portion overlaps the entire bottom gate portion, and the top gate portion overlaps the entire middle gate portion.

In some embodiments, the first channel layer includes a plurality of first nanowires. In some embodiments, the second channel layer includes a plurality of second nanowires.

Another aspect of the present disclosure provides a method for preparing a semiconductor structure. The method includes the following steps. A substrate is provided. At least one gate trench is formed in the substrate. A bottom gate portion is formed in the gate trench. In some embodiments, a top surface of the bottom gate portion is lower than an opening of the gate trench. Next, a channel layer is formed on the bottom gate portion in the gate trench. In some embodiments, a top surface of the channel layer is lower than the opening of the gate trench. Next, a top gate portion is formed on the channel layer in the gate trench.

In some embodiments, the forming the bottom gate portion further includes the following steps. A first gate dielectric layer covering sidewalls and a bottom of the gate trench is formed. A bottom gate conductive layer is formed to fill the gate trench. A portion of the first gate dielectric layer and a portion of the gate conductive layer are removed from the gale trench to form the bottom gate portion having the top surface lower than the opening of the trench. A second gate dielectric layer is formed on the bottom gate conductive layer.

In some embodiments, the channel layer includes an epitaxial semiconductor material.

In some embodiments, the method further includes patterning the channel layer to form a plurality of nanowires over the bottom gate portion in the gate trench.

In some embodiments, the forming the top gate portion further includes the following steps. A top gate dielectric layer covering the sidewalls of the gate trench and a top surface of the channel layer is formed. A top gate conductive layer is formed to fill the gate trench. A portion of the lop gate dielectric layer and a portion of the gate conductive layer are removed to form the top gate portion in the gate trench and to expose a surface of the substrate.

In the present disclosure, a method for preparing the semiconductor structure is provided. By forming the bottom gate portion, the top gate portion and the channel layer sandwiched therebetween, a dual-channel region is formed under a single voltage during operation. Consequently, gate control ability is improved due to the dual gate portions. Further, $I_{dsat}$ is increased and $I_{doff}$ is reduced due to the fully depleted channel layer. Further, since the channel layer is sandwiched between the bottom gate portion and the top gate portion, the bottom gate portion can be embedded more deeply in the substrate to reduce current leakage without increasing the channel length. Accordingly, subthreshold slope and on-off ratio are both increased.

In contrast, with a comparative semiconductor structure, the channel length is limited by the depth of the gate structure, and thus the semiconductor structure suffers from, lower $I_{dsat}$ and higher current leakage.

The foregoing has outlined rather broadly the features and technical advantages of the present disclosure in order that the detailed description of the disclosure that follows may be better understood. Additional features and technic& advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description.

DETAILED DESCRIPTION

Figure 1:
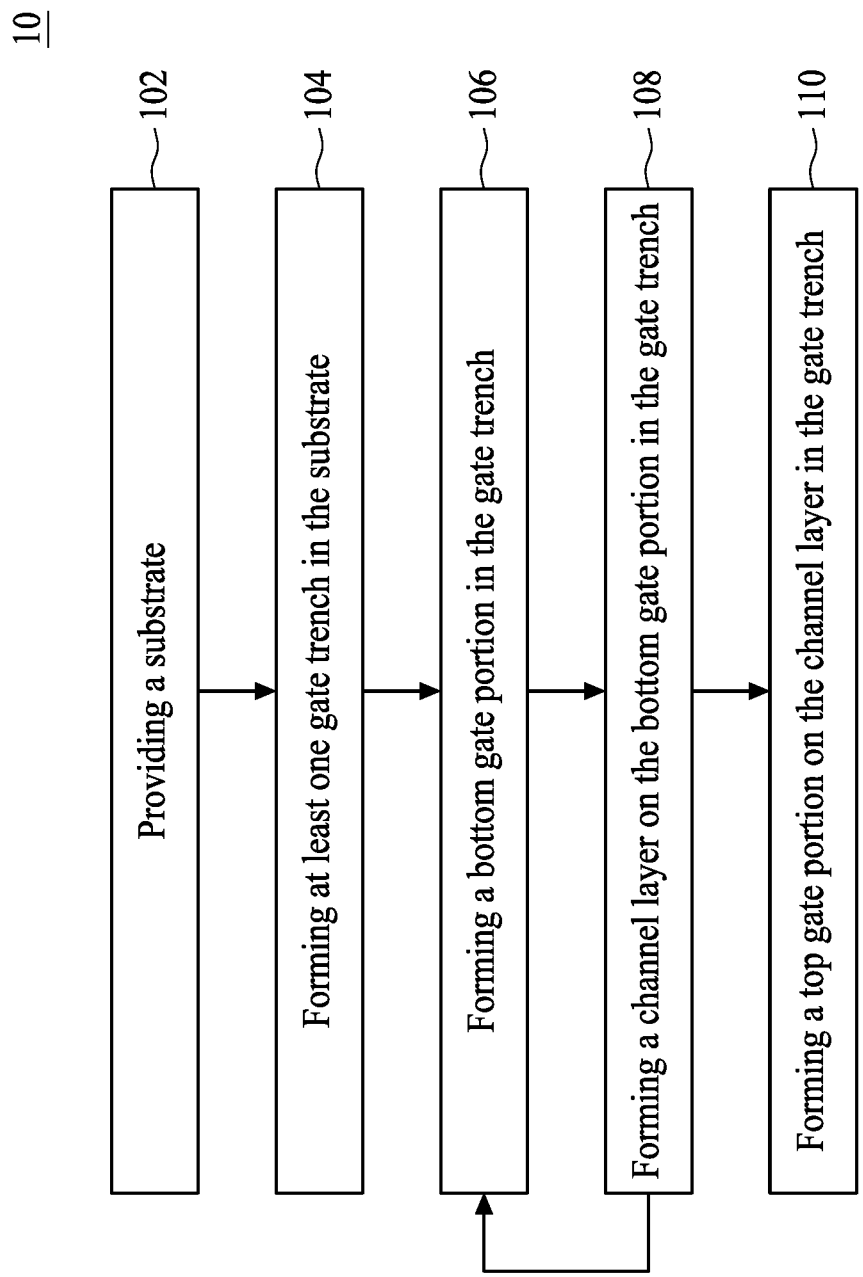
FIG. 1 is a flow diagram illustrating a method for preparing a semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals ma be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

As used herein, the terms "patterning" and "patterned" are used in the present disclosure to describe an operation of forming a predetermined pattern on a surface. The patterning operation includes various steps and processes and varies in accordance with different embodiments. In some embodiments, a patterning process is adopted to pattern an existing film or layer. The patterning process includes forming a mask on the existing film or layer and removing the unmasked film or layer with an etch or other removal process. The mask can be a photoresist, or a hard mask. In some embodiments, a patterning process is adopted to form a patterned layer directly on a surface. The patterning process includes forming a photosensitive film on the surface, conducting a photolithography process, and performing a developing process. The remaining photosensitive film is retained and integrated into the semiconductor device.

FIG. 1 is a flow diagram illustrating a method for preparing a semiconductor structure 10 in accordance with some embodiments of the present disclosure. The method for preparing the semiconductor structure 10 includes a step 102, in which a substrate is provided. The method for preparing the semiconductor structure 10 further includes a step 104, in which at least one gate trench is formed in the substrate. The method for preparing the semiconductor structure 10 further includes a step 106, in which a bottom gate portion is formed in the gate trench. In some embodiments, a top surface of the bottom gate portion is lower than an opening of the gate trench. The method for preparing the semiconductor structure 10 further includes a step 108, in which a channel layer is formed on the bottom gate portion in the gate trench. In some embodiments, a top surface of the channel layer is lower than the opening of the gate trench. The method for preparing the semiconductor structure 10 further includes a step 110, in which a top gate portion is formed on the channel layer in the gate trench. The method for preparing the semiconductor structure 10 will be further described according to one or more embodiments.

Figure 2:
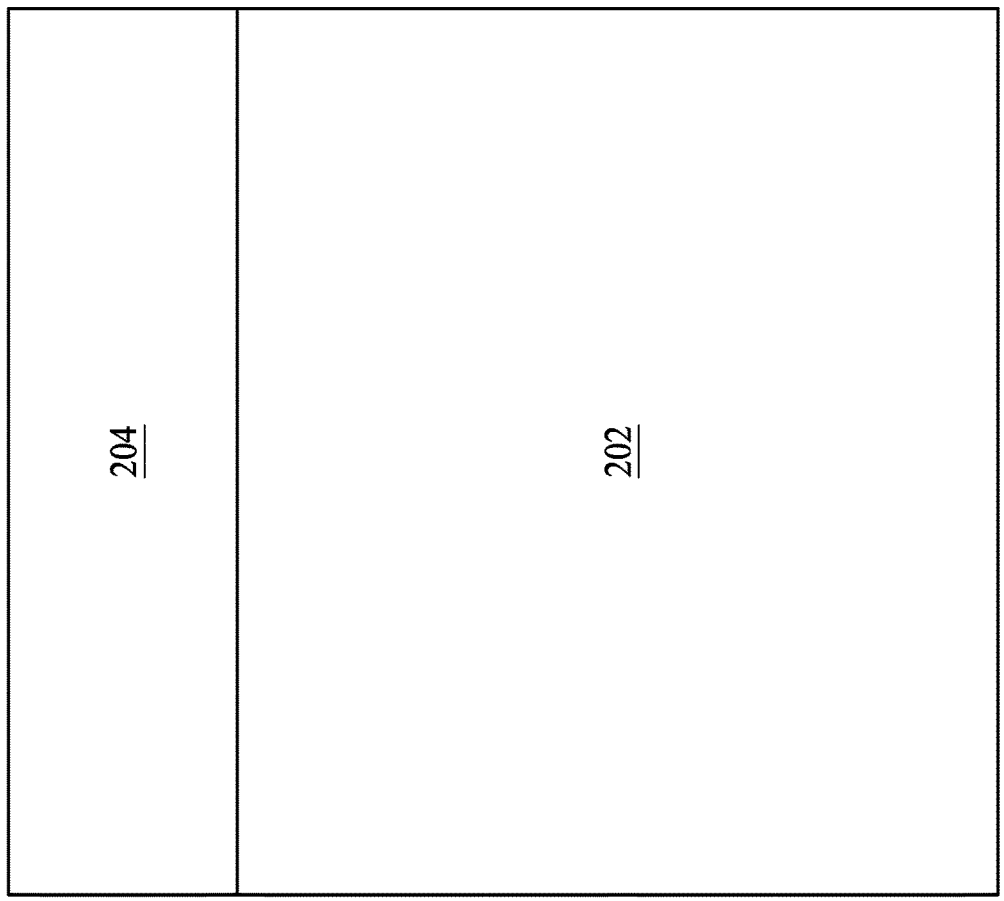
FIGS. 2, 3, 4, 5, 6, 7, 8, 9, and 10 are schematic diagrams illustrating various fabrication stages of the method for preparing the semiconductor structure in accordance with some embodiments of the present disclosure.

FIGS. 2, 3, 4, 5, 6, 7, 8, 9, and 10 are schematic diagrams illustrating various fabrication stages of the method for preparing the semiconductor structure in accordance with some embodiments of the present disclosure. Referring to FIG. 2, a substrate 202 is provided according to step 102. In some embodiments, the substrate 202 includes a silicon (Si) substrate, a germanium (Ge) substrate, or a silicon-germanium (SiGe) substrate, but the disclosure is not limited thereto. In some embodiments, the substrate 202 can include at least an isolation structure (not shown) for defining and electrically isolating at least an active region (not shown). In some embodiments, the isolation structure can be formed by shallow trench isolation (STI) technique, but the disclosure is not limited thereto. In some embodiments, an ion implantation for a p-well (not shown) can be performed after forming the isolation structure. In some embodiments, light-doped drain (LDD) regions 204 can be formed in the substrate 202, as shown in FIG. 2.

Figure 3:
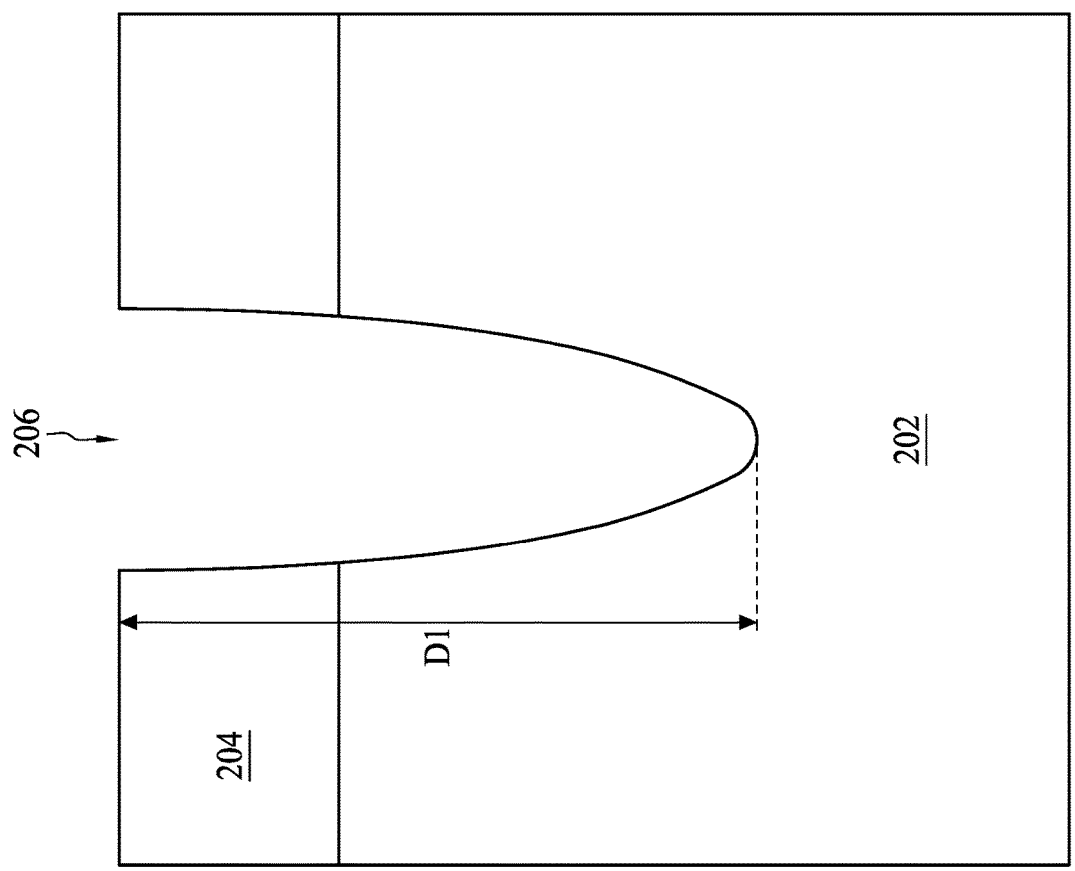

Referring to FIG. 3, next, at least one gate trench 206 is formed in the substrate 202 according to step 104. In some embodiments, a patterned mask (not shown) is formed on the substrate 202, and an etching process is performed to etch the substrate 202 with proper etchants. Consequently, the gate trench 206 is formed as shown in FIG. 3. In some embodiments, a first depth D1 of the gate trench 206 is in a range of 100 nanometers (nm) to 600 nm, but the disclosure is not limited thereto.

Figure 4:
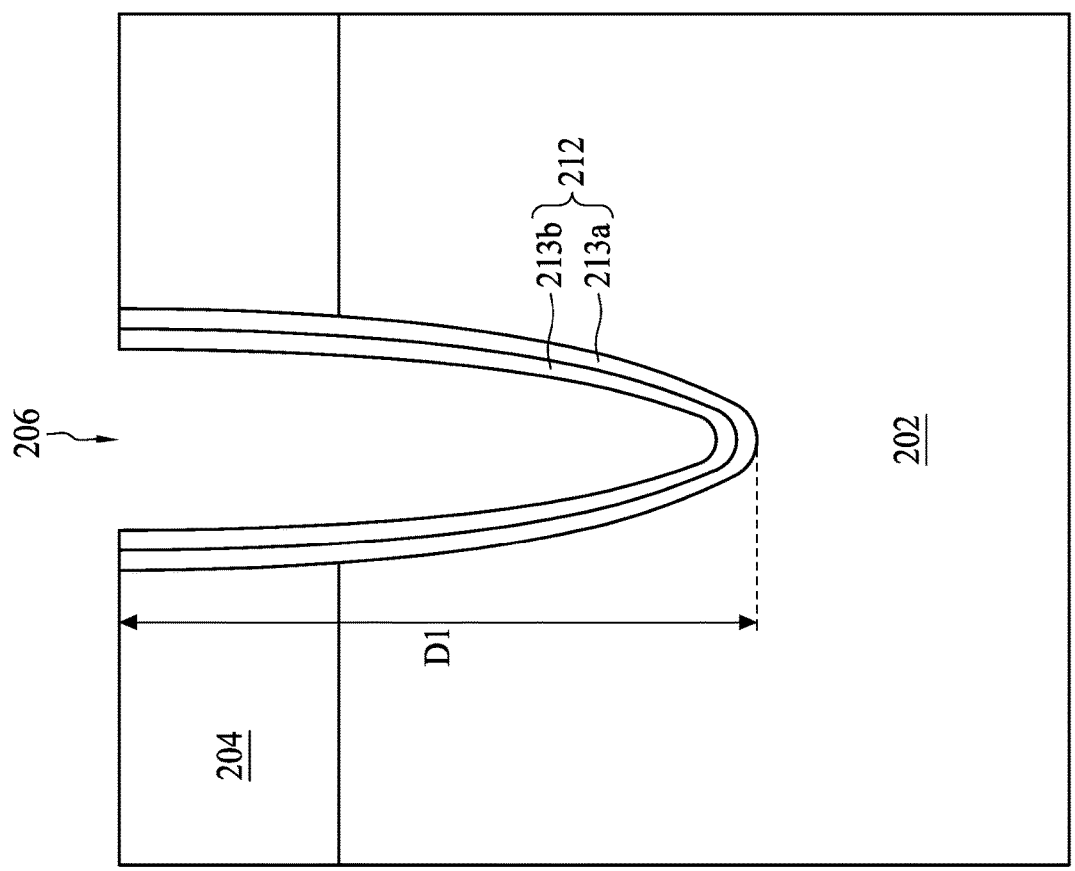

Next, a bottom gate portion 210 is formed in the gate trench according to step 106. In some embodiments, the step 106 for forming the bottom gate portion 210 further includes the following steps. In some embodiments, a first gate dielectric layer 212 is conformally formed in the gate trench 206. As shown in FIG. 4, the first gate dielectric layer 212 covers sidewalls and a bottom of the gate trench 206. In some embodiments, the first gate dielectric layer 212 can be a dual-layered structure including a SiO layer 213a and a SiN layer 213b, but the disclosure is not limited thereto.

Figure 5:
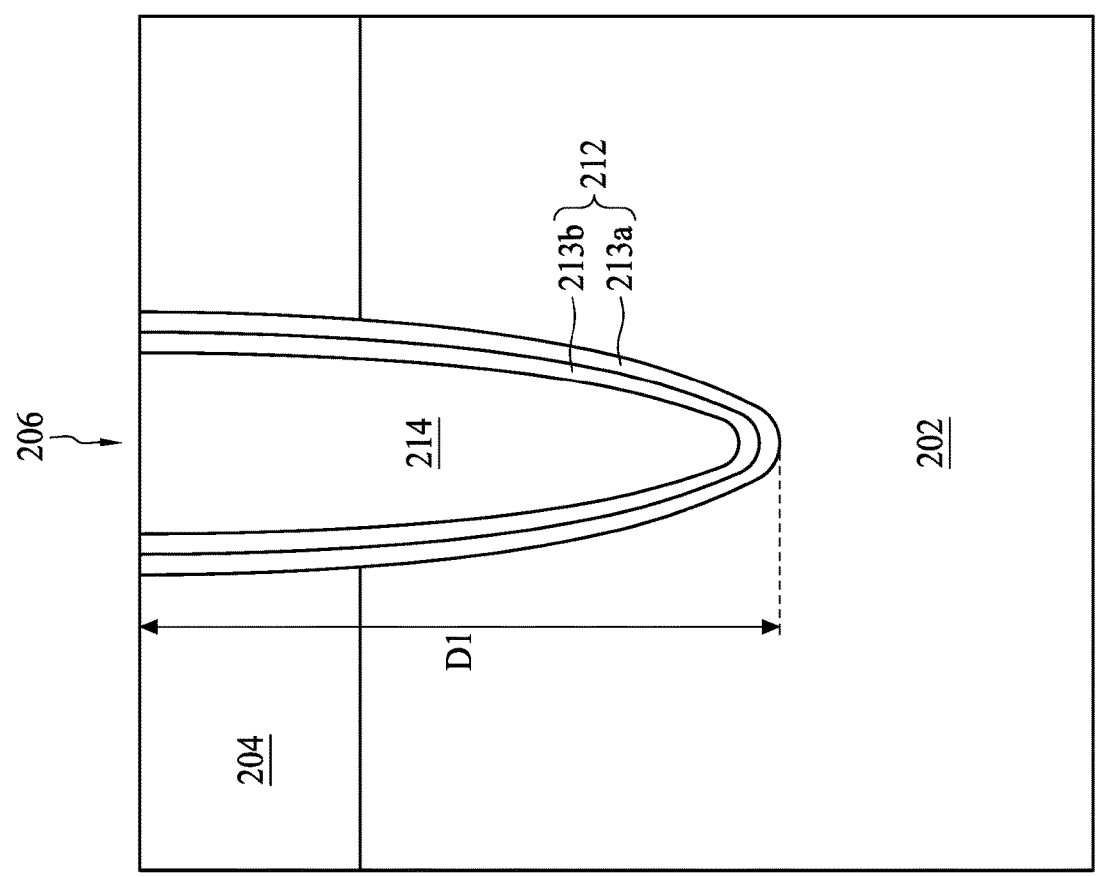

Referring to FIG. 5, next, a bottom gate conductive layer 214 is formed on the first gate dielectric layer 212 in the gate trench 206. In some embodiments, the bottom gate conductive layer 214 may be formed of any one of the group consisting of titanium nitride (TiN), titanium/titanium nitride (Ti/TiN), tungsten nitride (TiN), titanium/tungsten nitride (W/WN), tantalum nitride (TaN), tantalum/tantalum nitride (Ta/TaN), titanium silicon nitride (TiSiN), tantalum silicon nitride (TaSiN), tungsten silicon nitride (WSiN), or a combination thereof, but the disclosure is not limited thereto. The bottom gate conductive layer 214 may be formed using a chemical vapor deposition (CVD) or an atomic layer deposition (ALD) method, but the disclosure is not limited thereto. Accordingly, the gate trench 206 is filled with the bottom gate conductive layer 214, as shown in FIG. 5.

Figure 6:
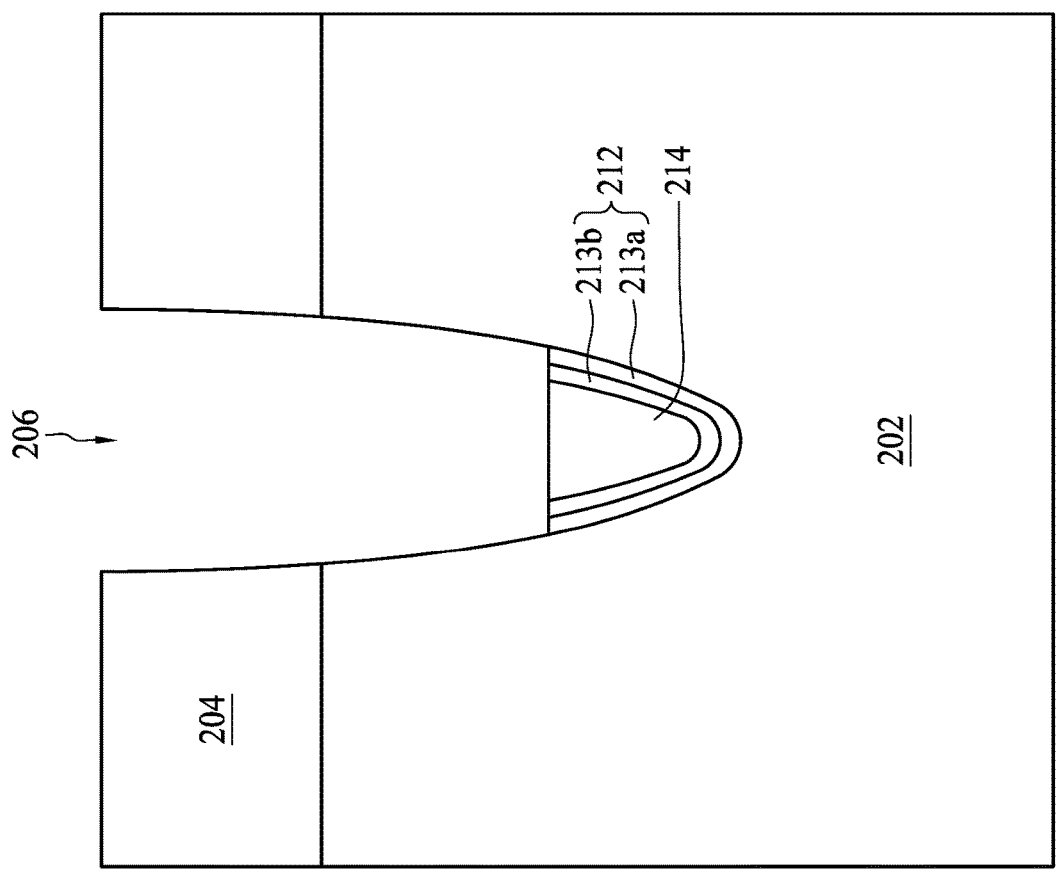
Figure 7:
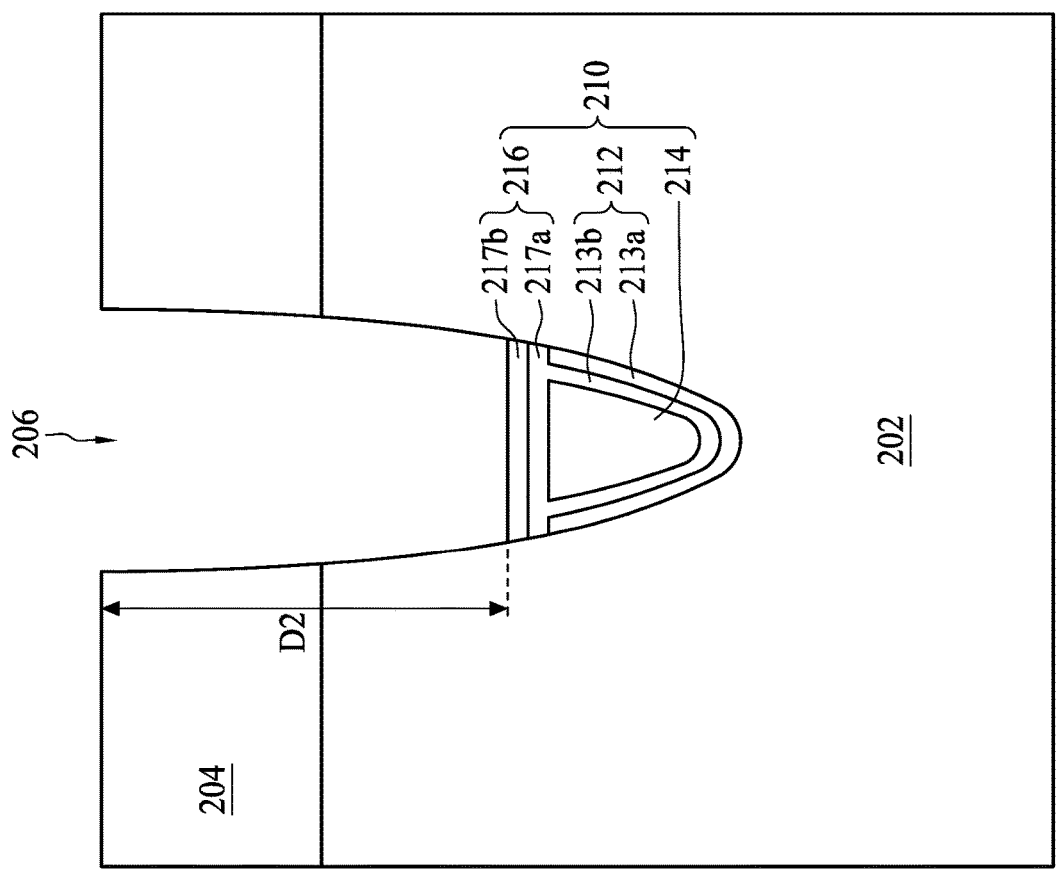

Next, a portion of the first gate dielectric layer 212 and a portion of the bottom gate conductive layer 214 are removed from the gate trench 206, as shown in FIG. 6. Subsequently, a second gate dielectric layer 216 is formed on the bottom gate conducive layer 214 as shown in FIG. 7. In some embodiments, the second gate dielectric layer 216 can be a dual-layered structure including a SiN layer 217a and a SiO layer 217b, but the disclosure is not limited thereto. Accordingly, the bottom gate portion 210 is formed in the gate trench 206. In some embodiments, at least a portion of the bottom gate conductive layer 214 is covered by the second gate, dielectric layer 216. As shown in FIG. 7, a top surface of the bottom gate portion 210 is lower than an opening of the gate trench 206. Further, since the bottom gate portion 210 is formed in a lower portion of the gate trench 206, the first depth D1 of the gate trench 206 is reduced to a second depth D2. In some embodiments, the second depth D2 is in a range of 80 nm to 580 nm, but the disclosure is not limited thereto. Additionally, a portion of sidewalls of the gate trench 206 is exposed after forming the bottom gate portion 210.

Figure 8:
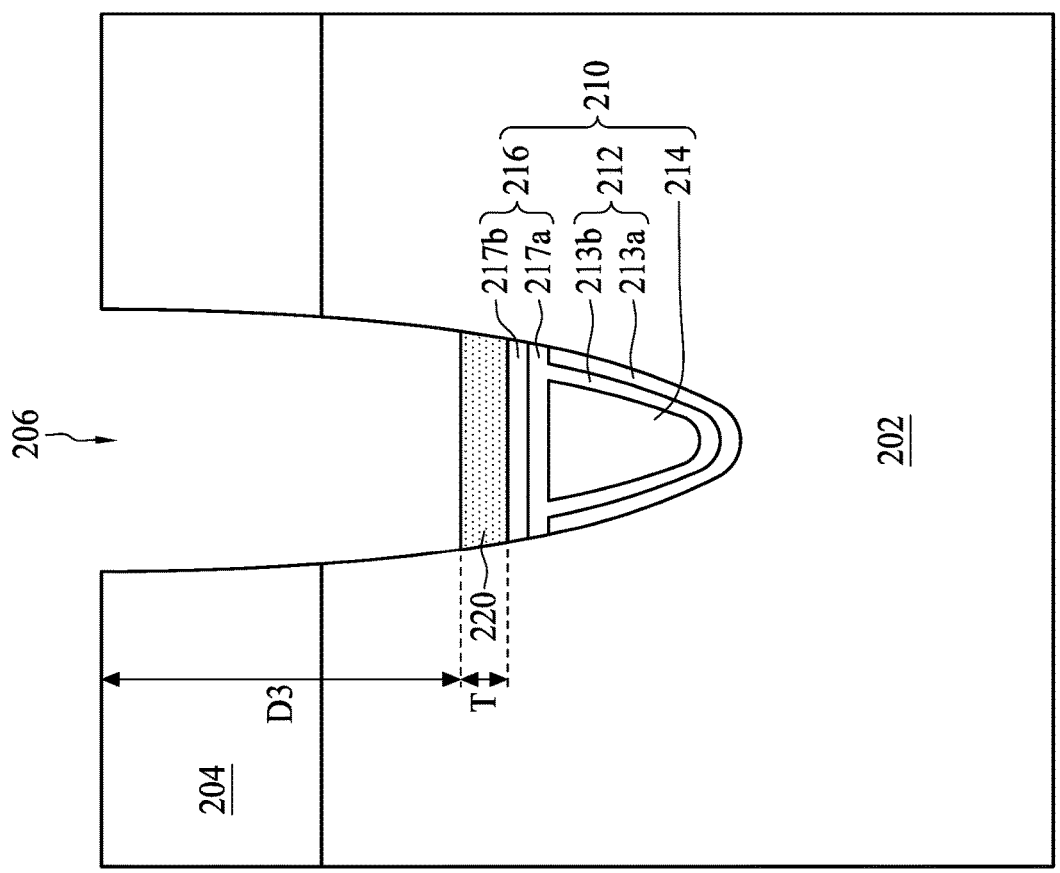

Referring to FIG. 8, after forming the bottom gate portion 210, a channel layer 220 is formed on the bottom gate portion 210 in the gate trench 206 according to step 108. As shown in FIG. 8, a top surface of the channel layer 220 is lower than the opening of the gate trench 206. In some embodiments, the channel layer 220 includes an epitaxial semiconductor material, such as epitaxial silicon, but the disclosure is not limited thereto. The channel layer 220 includes a thickness T. In some embodiments, the thickness T of the channel layer 220 is in a range of 3 nm to 20 nm, but the disclosure is not limited thereto. In some embodiments, the second depth D2 of the gate trench 206 is reduced to a third depth D3 due to the forming of the channel layer 220. In some embodiments, the third depth D3 of the gate trench 206 is in a range of 70 nm to 560 nm, but the disclosure is not limited thereto.

Figure 9:
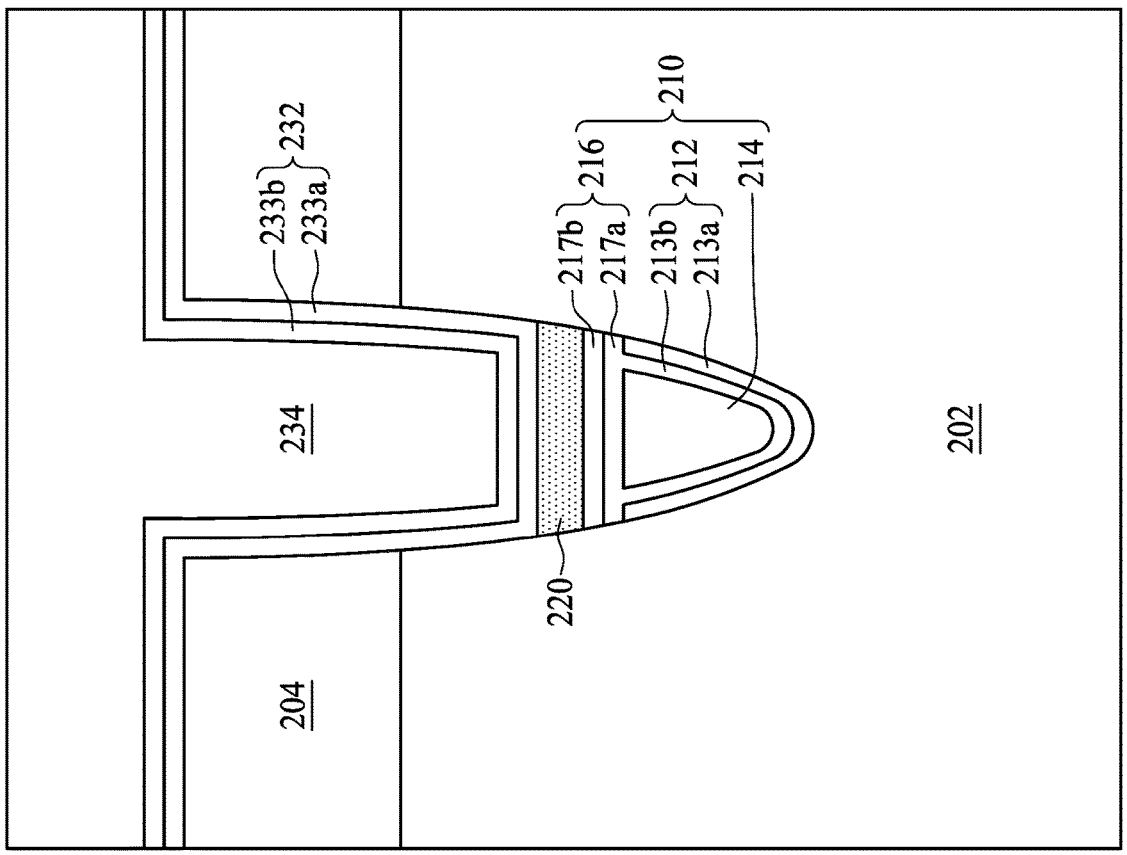

Referring to FIG. 9, next, a top gate portion 230 is formed on the channel layer 220 in the gate trench 206 according to step 110. In some embodiments, the step 110 for forming the top gate portion 230 further includes the following steps. In some embodiments, a top gate dielectric layer 232 is conformally formed in the gate trench 206. As shown in FIG. 9, the top gate dielectric layer 232 covers sidewalls of the gate trench 206 and the top surface of the channel layer 220. In some embodiments, the top gate dielectric layer 232 can be a dual-layered structure including a SiO layer 233a and a SiN layer 233b, but the disclosure is not limited thereto. Next, a top gate conductive layer 234 is formed on the top gate dielectric layer 232 in the gate trench 206. In some embodiments, the top gate conductive layer 234 may be formed of any one of the group consisting of TiN, Ti/TiN, WN, W/WN, TaN, Ta/TaN, TiSiN, TaSiN, WSiN, or a combination thereof, but the disclosure is not limited thereto. The top gate conductive layer 234 may be formed using a CVD or an ALD method, but the disclosure is not limited thereto. Accordingly, the gate trench 206 is filled with the top gate conductive layer 234, as shown in FIG. 9.

Figure 10:
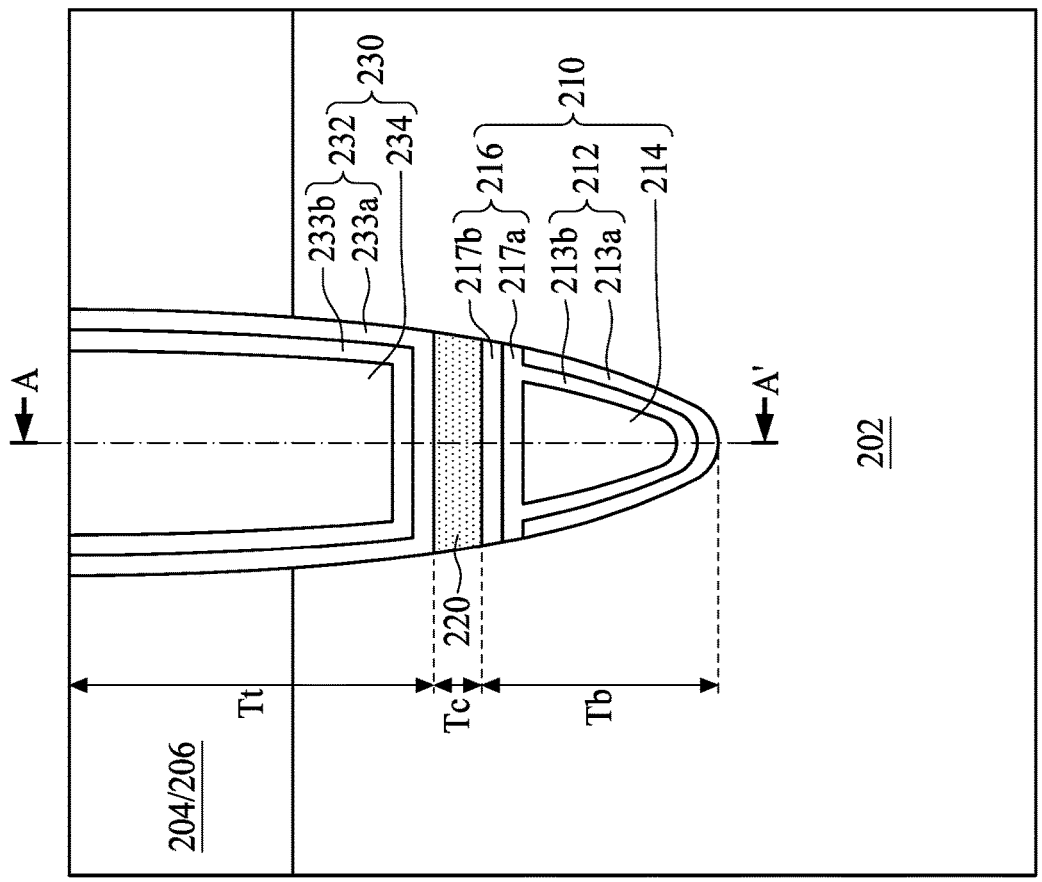

Referring to FIG. 10, after forming the top gate conductive layer 234, a portion of the top gate dielectric layer 232 and a portion of the top gate conductive layer 234 are removed to form the top gate portion 230 in the gate trench 206 and to expose a surface of the substrate 202. In some embodiments, a source/drain region 206 can be formed in the substrate 202 as shown in FIG. 10.

Figure 11:
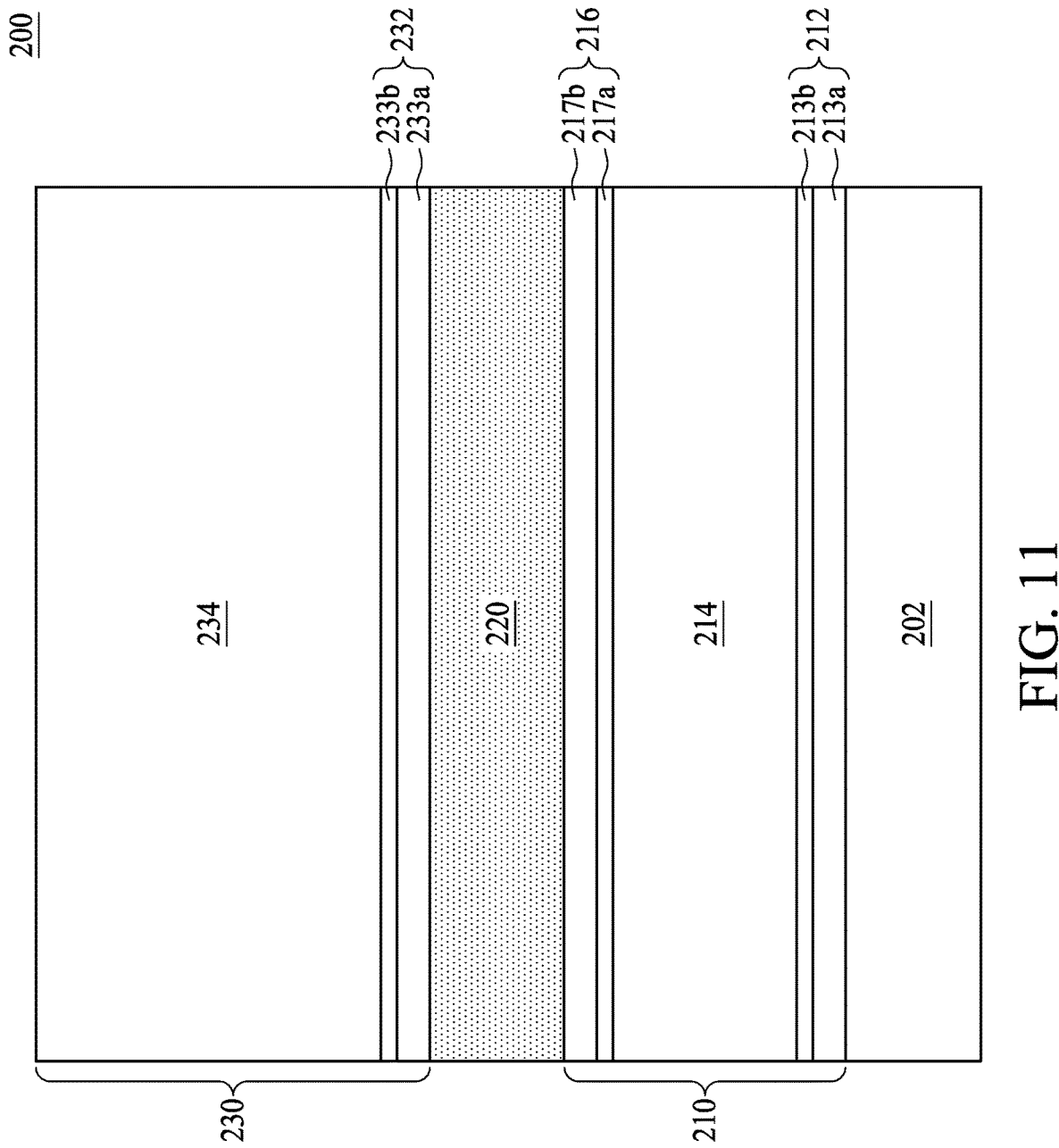
FIG. 11 is a schematic diagram illustrating the semiconductor structure as seen in a cross-sectional view taken along line A-A' of FIG. 10.

Please refer to FIGS. 10 and 11, wherein FIG. 11 is a schematic diagram illustrating the semiconductor structure as seen in a cross-sectional view taken along line A-A' of FIG. 10. According to the method for preparing the semiconductor structure 10, the semiconductor structure 200 is provided. The semiconductor structure 200 includes the substrate 202, the bottom gate portion 210 disposed in the substrate 202, the top gate portion 230 stacked over the bottom gate portion 210, the channel layer 220 sandwiched between the top gate portion 230 and the bottom gate portion 210, and a source/drain region 206 disposed in the substrate 202 at two opposite sides of the top gate portion 230. As mentioned above, the bottom gate portion 210 includes the bottom gate conductive layer 214 and the bottom gate dielectric layer including the first gate dielectric layer 212 and the second gate dielectric layer 216. As mentioned above, the first gate dielectric layer 212 can be a dual-layered structure, and the second dielectric layer 216 can be a dual-layered structure. As shown in FIG. 10, the bottom gate conductive layer 214 is separated from the substrate 202 and the channel layer 220 by the bottom gate dielectric layer 212 and 216. As mentioned above, the top gate portion 230 includes the top gate conductive layer 234 and the top gate dielectric layer 232. In some embodiments, the top gate dielectric layer 232 can be a dual-layered structure. As shown in FIG. 10, the top gate conductive layer 234 is separated from the substrate 202 and the channel layer 220 by the top gate dielectric layer 232. In some embodiments, a thickness Tt of the top gate portion 230 is equal to a thickness Tb of the bottom gate portion 210. In some embodiments, the thickness Tt of the top gate portion 230 is greater than the thickness Tb of the bottom gate portion 210. In some embodiments, a bottom surface of the source/drain region 206 is higher than a bottom surface of the top gate portion 230. In some embodiments, the bottom surface of the source/drain region 206 is at a level substantially the same as that of the bottom surface of the top gate portion 230.

Referring to FIG. 10, a width of the channel layer 220 is equal to or less than a width of the top gate portion 230, and a width of the bottom gate portion 210 is equal to or less than the width of the channel layer 220. In some embodiments, the top gate portion 230 overlaps the entire channel layer 220, and the channel layer 220 overlaps the entire bottom gate portion 210, as shown in FIG. 10. In some embodiments, the bottom gate portion 210 and the top gate portion 230 are electrically connected, although this is not shown.

Figure 12:
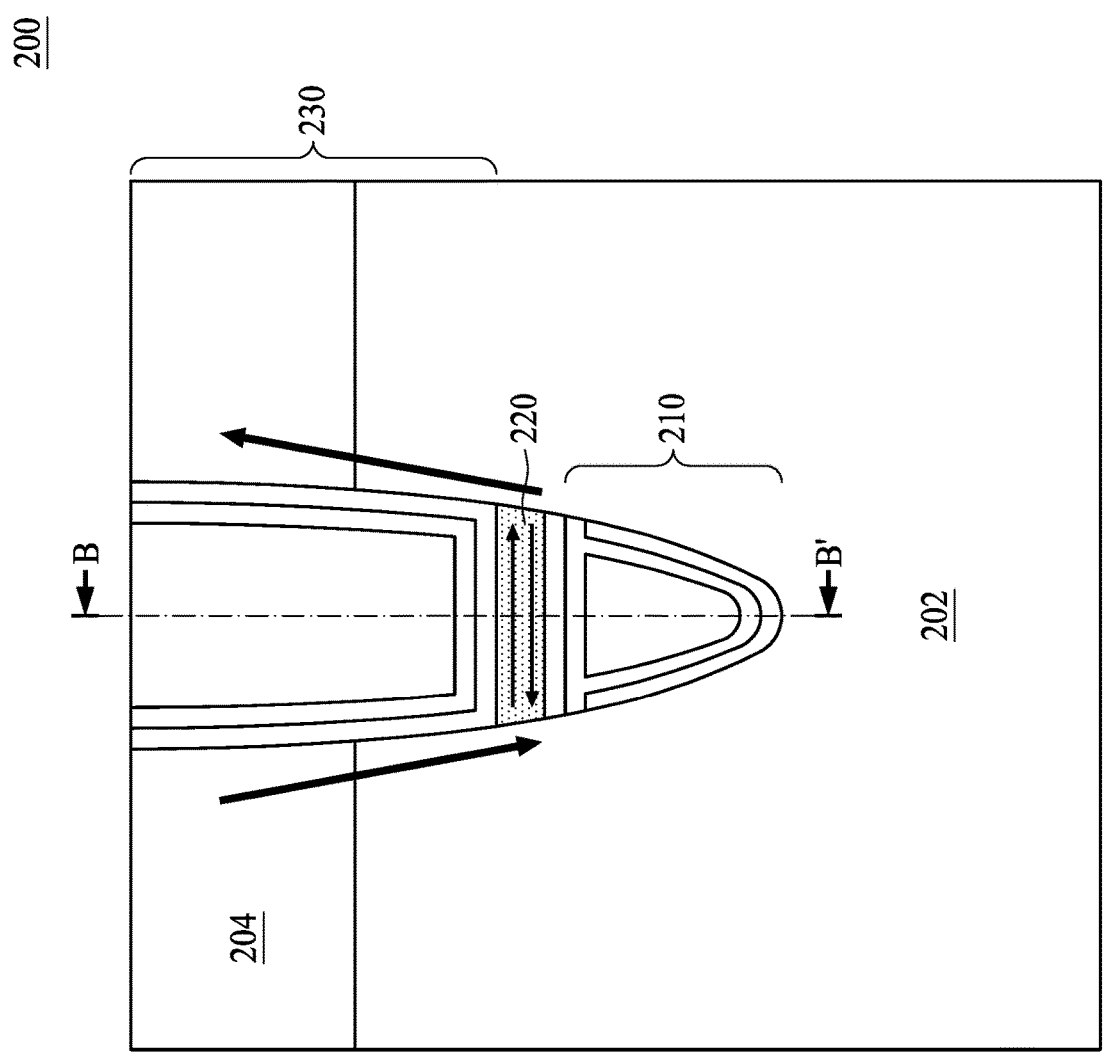
FIG. 12 is a schematic diagram illustrating the semiconductor structure in operation in accordance with some embodiments of the present disclosure.
Figure 13:
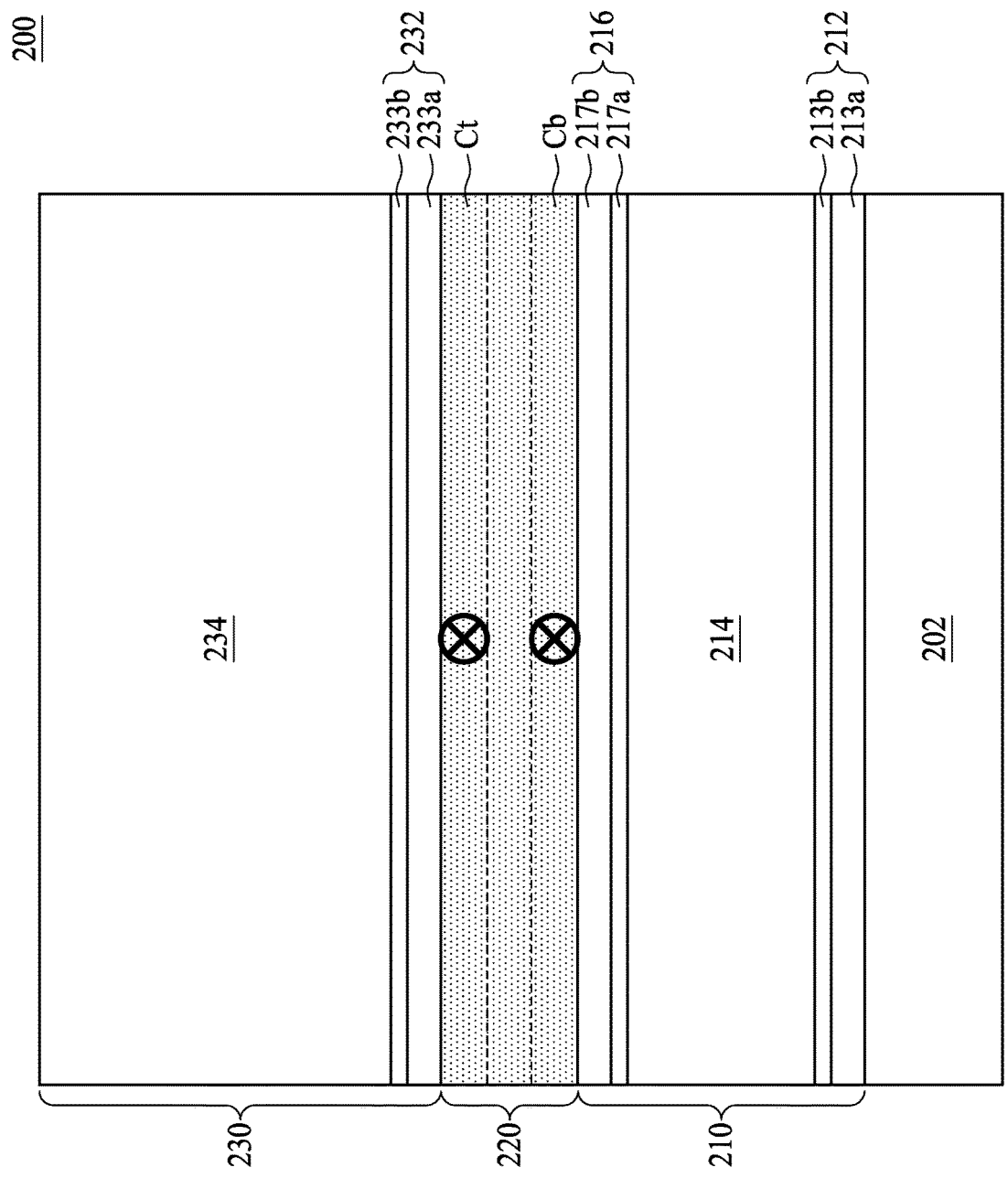
FIG. 13 is a schematic diagram illustrating the semiconductor structure as seen in a cross-sectional view taken along line B-B' of FIG. 12.

Please refer to FIGS. 12 and 13, wherein FIG. 12 is a schematic diagram illustrating the semiconductor structure 200 in operation, and FIG. 13 is a schematic diagram illustrating the semiconductor structure 200 as seen in a cross-sectional view taken along line B-B' of FIG. 12. As shown in FIGS. 12 and 13, the semiconductor structure 200 is a dual-gate structure which includes the top gate portion 230 and the bottom gate portion 210. Since the top, gate portion 230 and the bottom gate portion 210 are electrically connected as mentioned above, a top channel region Ct is generated in the channel layer 220 and a bottom channel region Cb is generated in the channel layer 220 at the same time. By applying a single voltage to the dual-gate structure, two channel regions Ct, and Cb are generated individually and simultaneously. Accordingly, gate control ability is improved. Further, since the channel layer 220 is fully depleted and a shortcut is thereby provided between the source/drain region 206, $I_{dsat}$ is increased. Further, $I_{doff}$ is reduced due to the fully depleted channel layer 220. As is a result, subthreshold slope and on-off ratio are increased.

Figure 14:
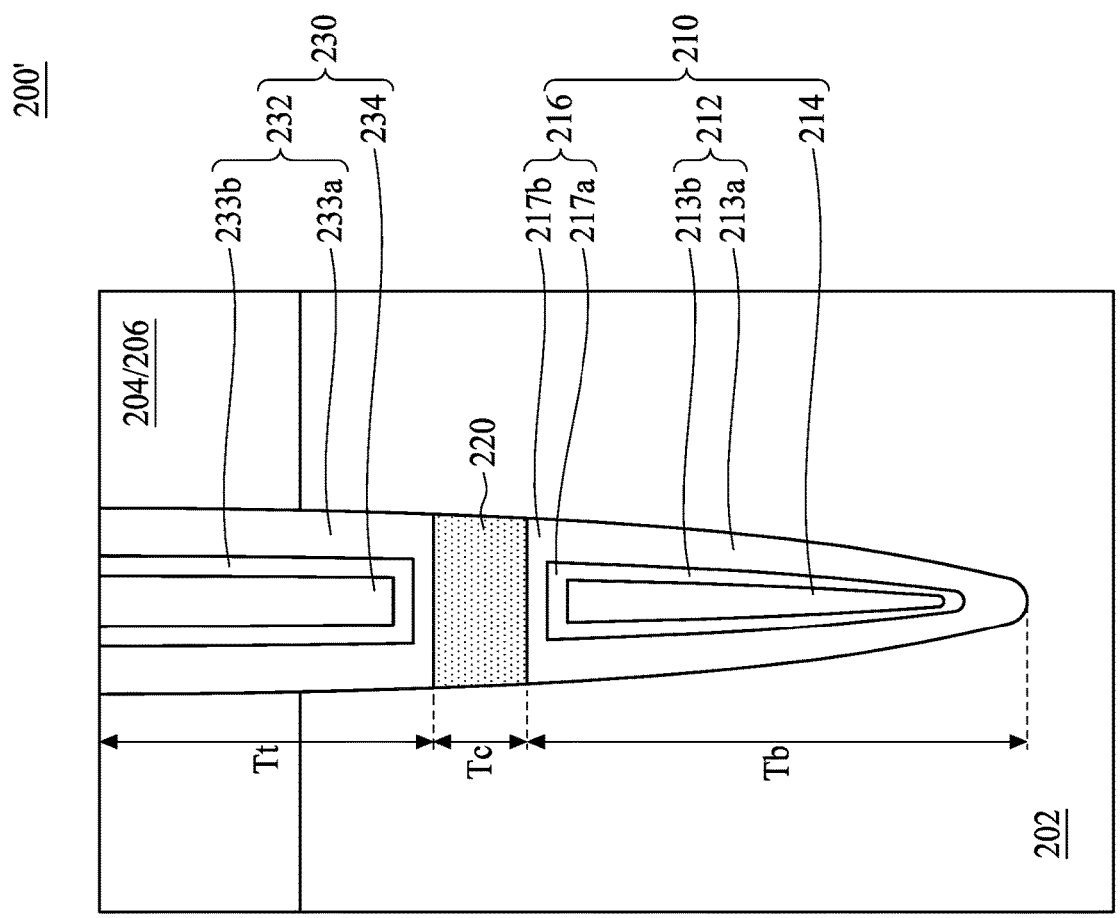
FIG. 14 is a schematic diagram illustrating a semiconductor structure in accordance with some embodiments of the present disclosure.

Please refer to FIG. 14, which is a schematic diagram illustrating a semiconductor structure 200' in accordance with some embodiments of the present disclosure. It should be noted that similar elements in FIGS. 10 and 14 can include similar materials and can be formed by similar steps; therefore, such details are omitted in the interest of brevity. In some embodiments, the semiconductor structure 200' can include a deeper gate trench 206. Thus, the bottom gate portion 210 is formed more deeply in the substrate 202, as shown in FIG. 14. In some embodiments, the thickness Tb of the bottom gate portion 210 is greater than the thickness Tt of the top gate portion 230. By introducing the deeper bottom gate portion 210, leakage current is further reduced. However, the channel layer 220 still serves as a shortcut between the source/drain region 206. Therefore, the leakage current is reduced without affecting $I_{dsat}$.

Figure 15:
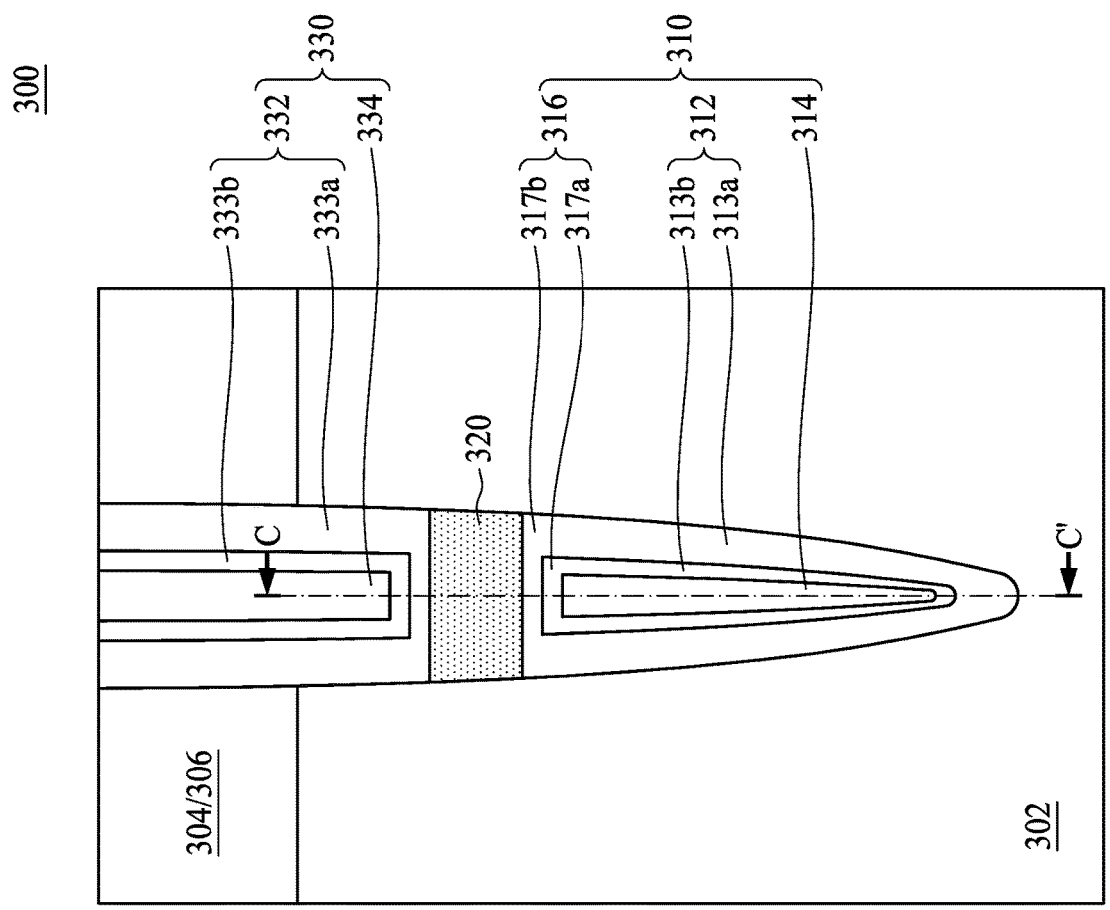
FIG. 15 is a schematic diagram illustrating a semiconductor structure in accordance with some embodiments of the present disclosure.
Figure 16:
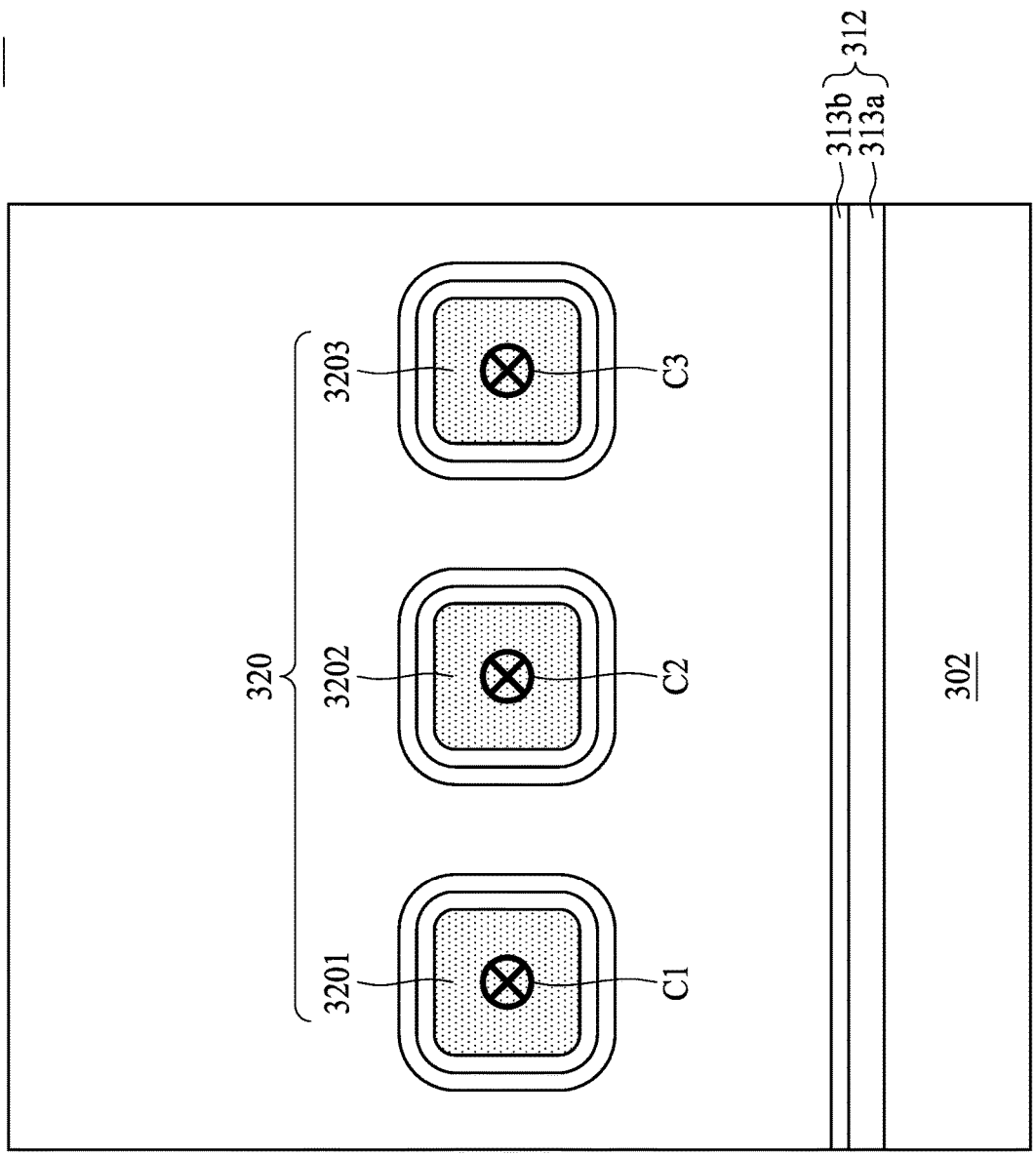
FIG. 16 is a schematic diagram illustrating the semiconductor structure as seen in a cross-sectional view taken along line C-C' of FIG. 15.
Figure 17:
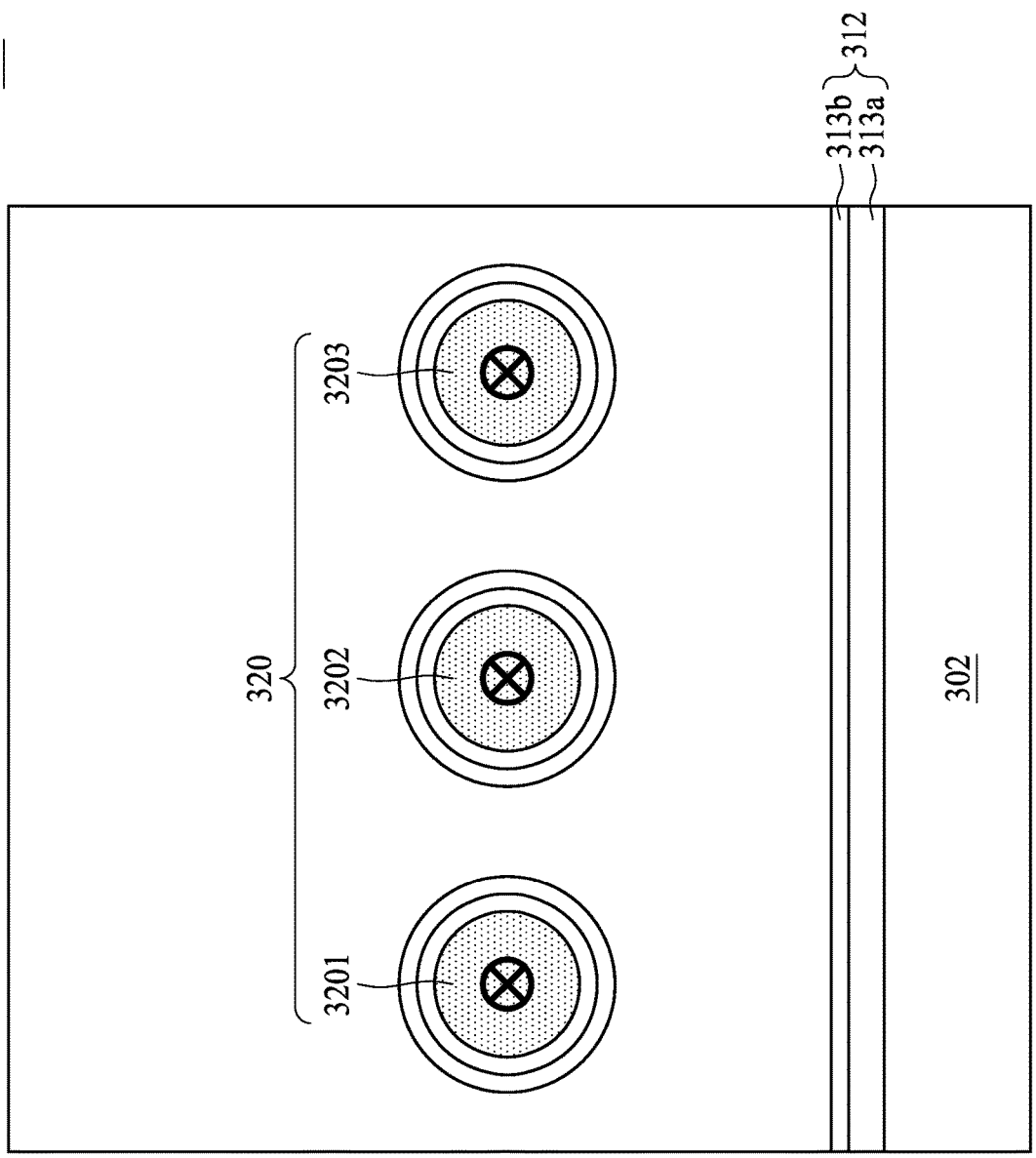
FIG. 17 is a schematic diagram illustrating the semiconductor structure as seen in a cross-sectional view taken along in line C-C' of FIG. 15.

Please refer to FIGS. 15 through 17, wherein FIG. 15 is a schematic diagram illustrating a semiconductor structure 300 in accordance with some embodiments of the present disclosure, and FIGS. 16 and 17 are schematic diagrams illustrating the semiconductor structure 300 as seen in cross-sectional views taken along line C-C' of FIG. 15. It should be noted that similar elements in FIGS. 10 through 11 and FIGS. 15 through 17 can be formed by similar steps; therefore, such details are omitted in the interest of brevity. In some embodiments, step 102 is performed to provide a substrate 302. Step 104 is performed to form at least one gate trench (not shown) in the substrate 302. Step 106 is performed to form a bottom gate portion 310 in the gate trench. In some embodiments, a top surface of the bottom gate portion 310 is lower than an opening of the gate trench or lower than a surface of the substrate 302. Next, step 108 is performed to form a channel layer 320 on the bottom gate portion 310 in the gate trench. In some embodiments, step 108 includes the following steps. In some embodiments, the channel layer 320 is patterned to form a plurality of nanowires 3201, 3202, 3203, . . . , 320n, as shown in FIG. 16. A portion of the bottom gate portion 310 is removed such that the nanowires 3201, 3202, 3203, . . . , 320n suspended and free-standing in the gate trench 206.

Next, step 110 is performed to form the top gate portion 330. The top gate portion 330 includes gate dielectric layer 332 and gate conductive layer 334. As shown in FIGS. 16 and 17, the top gate portion 320 can surround the nanowires 3201, 3202, 3203, . . . 320n. In some embodiments, an anneal process is performed such that the nanowires 3201, 3202, 3203, . . . , 320n are rounded, as shown in FIG. 17. Finally, step 110 is performed to form the top gate portion 330.

Accordingly, the semiconductor structure 300 is provided, as shown in FIGS. 15 through 17. Further, the channel layer 320 of the semiconductor structure 300 includes the nanowires 3201, 3202, 3203, . . . , 320n which are laterally arranged. In some embodiments, the nanowires 3201, 3202, 3203, . . . , 320n are arranged along a direction parallel with the surface of the substrate 302. Further, the top gate portion 330 and the bottom gate portion 310 may be physically and electrically connected to each other, and thus the nanowires 3201, 3202, 3203, . . . , 320n are embedded in and surrounded by the top gate portion 330 and the bottom gate portion 310, as shown in FIGS. 16 and 17. However, the nanowires 3201, 3202, 3203, . . . , 320n are separated from and electrically isolated from the top gate portion 330 and the bottom gate portion 310.

Please still refer to FIGS. 16 and 17. Since the nanowires 3201, 3202, 3203, . . . , 320n are embedded in and surrounded by the top gate portion 330 and the bottom gate portion 310, which are physically and electrically connected to each other, a plurality of channel regions C1, C2, C3 . . . Cn are simultaneously generated in the nanowires 3201, 3202, 3203, . . . , 320n. Consequently, the semiconductor structure 300 is a gate-all-around (GAA) structure. By applying a single voltage to the GAA structure, the plurality of channel regions C1, C2, C3, . . . , Cn are generated individually and simultaneously in the nanowires 3201, 3202, 3203, . . . , 320n. Accordingly, gate control ability is improved. Further, since the channel layer 320 is fully depleted and a shortcut is thereby provided between the source/drain region 306, $I_{dsat}$ is increased. Further, $I_{doff}$ is reduced due to the fully depleted channel layer 320. As a result, subthreshold slope and on-off ratio are increased.

Figure 18:
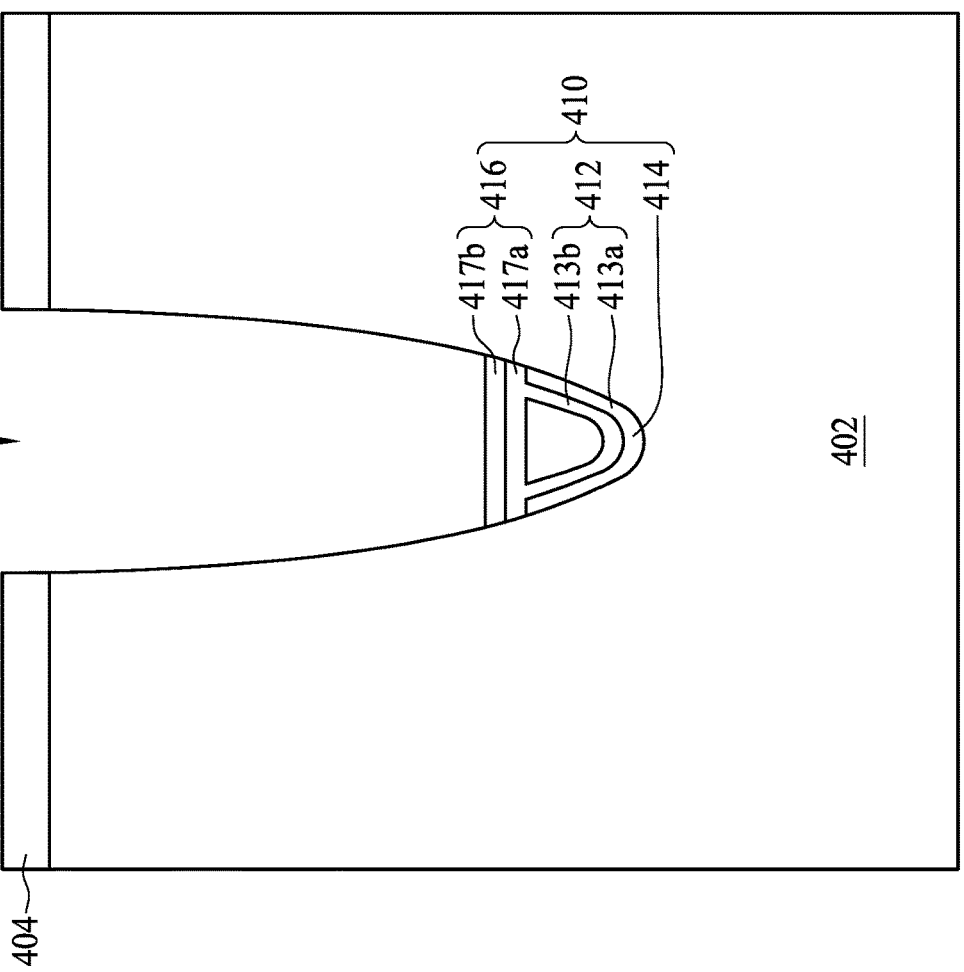
FIGS. 18, 19, 20, 21, and 22 are schematic diagrams illustrating various fabrication stages of the method for preparing the semiconductor structure in accordance with some embodiments of the present disclosure.

FIGS. 18, 19, 20, 21, and 22 are schematic diagrams illustrating various fabrication stages of the method for preparing the semiconductor structure in accordance with some embodiments of the present disclosure. It should be noted that similar elements in FIGS. 2 through 10 and FIGS. 18 through 22 can include similar materials; therefore, such details are omitted in the interest of brevity. Referring to FIG. 18, a substrate 402 is provided according to step 102. In some embodiments, the substrate 402 includes at least an isolation structure (not shown) for defining and electrically isolating at least an active region (not shown). In some embodiments, the substrate 402 can include at least one p-type well region and light-doped drain (LDD) regions 404 formed in the substrate 402 over the well region. Next, at least one gate trench 406 is formed in the substrate 402 according to step 104. After forming the gate trench 406, step 106 is performed to for err a bottom gate portion 410 in the gate trench 406. In some embodiments, the step 106 for forming the bottom gate portion 410 further includes the following steps. In some embodiments, a first gate dielectric layer 412 covering sidewalk and a bottom of the gate trench 406 is conformally formed in the gate trench 406. In some embodiments, the first gate dielectric layer 412 can be a dual-layered structure including a SiO layer 413a and a SiN layer 413b, but the disclosure is not limited thereto. A bottom gate conductive layer 414 is then formed on the first gate dielectric layer 412 in the gate trench 406. A portion of the first gate dielectric layer 412 and a portion of the bottom gate conductive layer 414 are removed from the gate trench 406, and a second gate dielectric layer 416 is formed on the bottom gate conducive layer 414. In some embodiments, the second gate dielectric layer 416 can be a dual-layered structure including a SiN layer 417a and a SiO layer 417b, but the disclosure is not limited thereto. Accordingly, the bottom gate portion 410 is formed in the gate trench 406, and a top surface of the bottom gate portion 410 is lower than an opening of the gate trench 406, as shown in FIG. 18.

Figure 19:
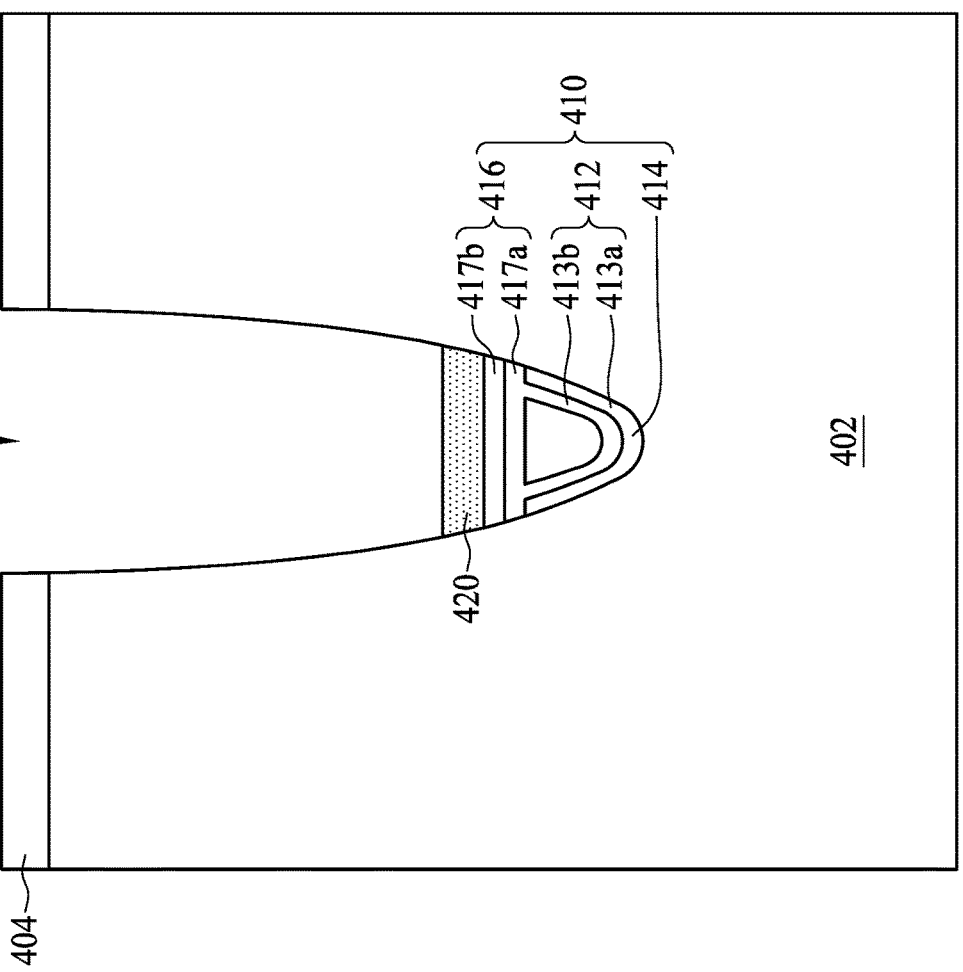

Referring to FIG. 19, after forming the bottom gate portion 410, a channel layer 420 is formed on the bottom gate portion 410 in the gate trench 406 according to step 108. As shown in FIG. 19, a top surface of the channel layer 420 is lower than the opening of the gate trench 406. In some embodiments, the channel layer 420 includes an epitaxial semiconductor material, such as epitaxial Si, but the disclosure is not limited thereto.

Figure 20:
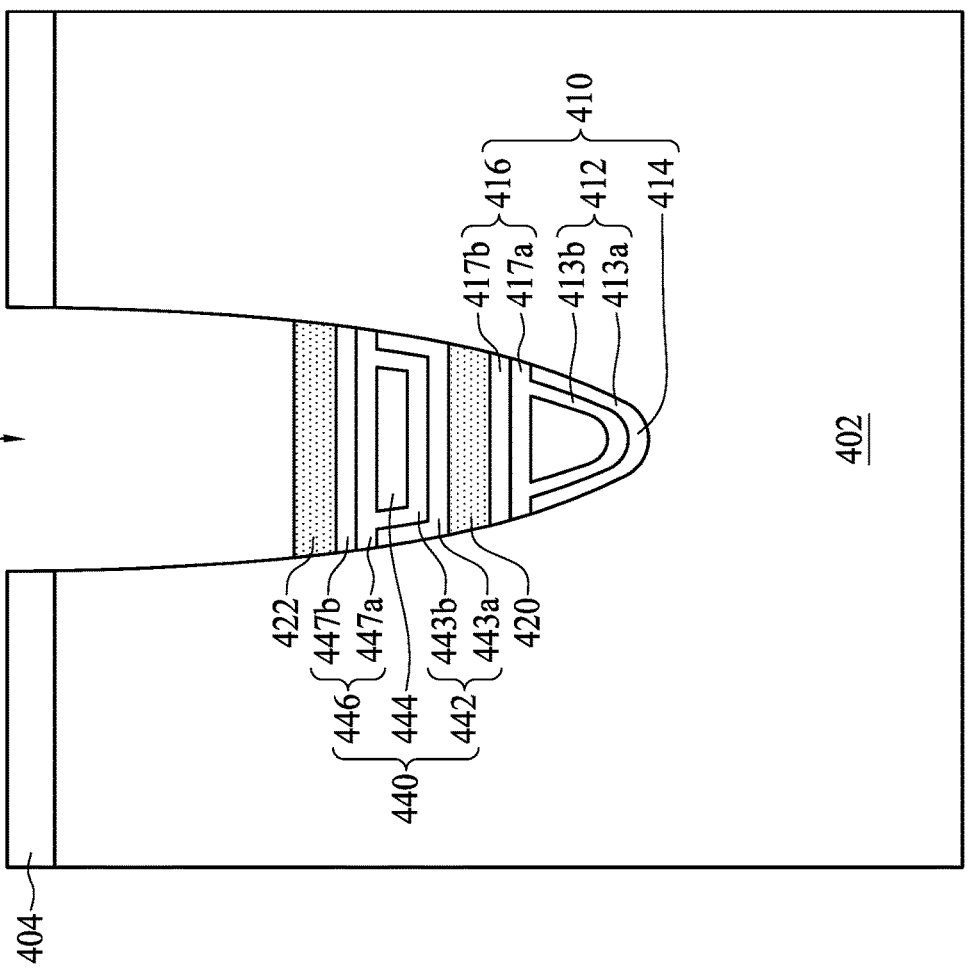

Referring to FIG. 20, in some embodiments, step 106 and 108 can be repeatedly performed. For example, step 106 and 108 can be sequentially performed a second time to form a first middle gate portion 440 on the channel layer 420 and to form a channel layer 422 on the first middle gate portion 440. Importantly, a top surface of the first middle gate portion 440 and a top surface of the channel layer 422 are lower than the opening of the gate trench 406, as shown in FIG. 20. In some embodiments, steps for forming the first middle gate portion 440 are similar to those mentioned above; therefore such details are omitted for brevity. As shown in FIG. 20, the first middle gate portion 440 can include a dual-layered gate dielectric layer 442 including a SiO layer 443a and a SiN layer 443b, a first middle gate conductive layer 444, and a dual-layered gate dielectric layer 446 including a SiN layer 447a and a SiO layer 447b. The dual-layered gate dielectric layer 442 and the dual-layered gate dielectric layer 446 form a first middle gate dielectric layer. As shown in FIG. 20, the first middle gate conductive layer 444 is separated from and electrically isolated from the substrate 402, the channel layer 420 and the channel layer 422 by the first middle gate dielectric layer 442 and 446. In some embodiments, step 110 can next be performed to form a top gate portion on the channel layer 422.

Figure 21:
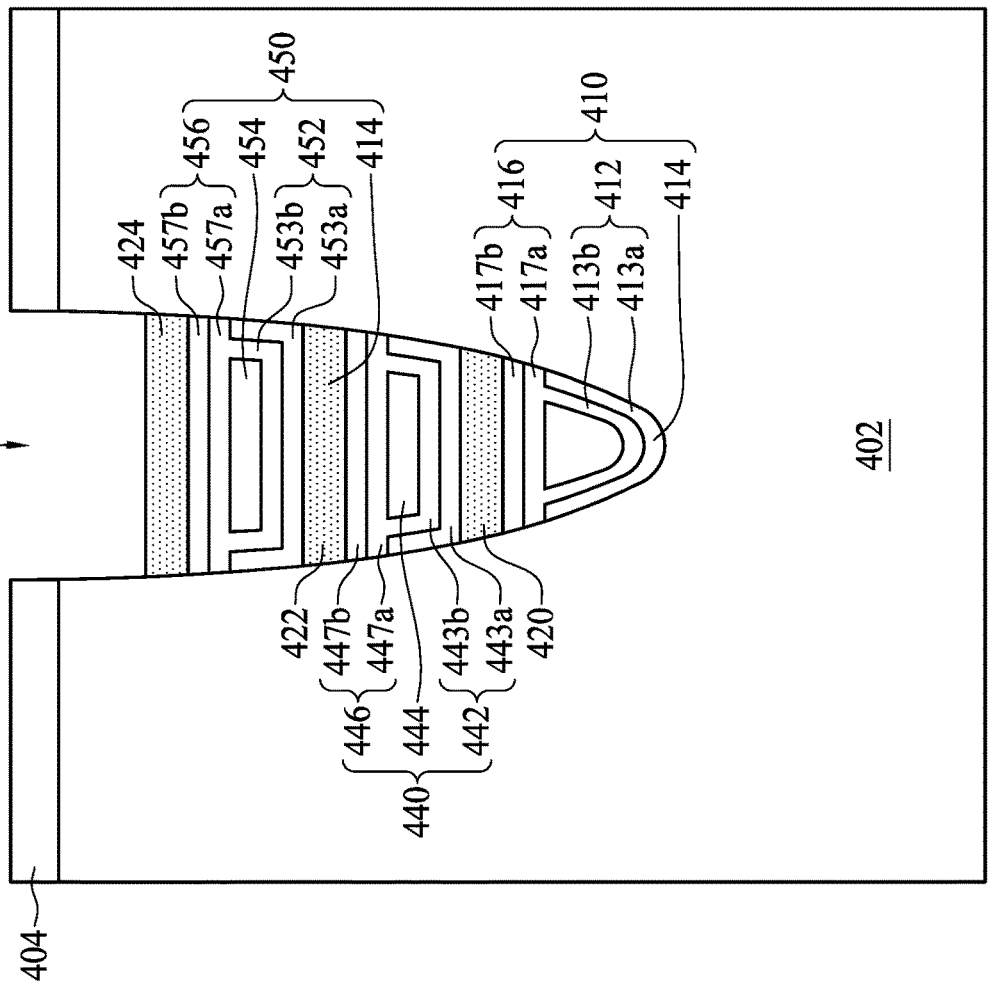

Referring to FIG. 21, in some embodiments, step 106 and step 108 can be repeatedly performed. For example, steps 106 and 108 can be sequentially performed a second time and a third time to form a first middle gate portion 440 on the channel layer 420, a channel layer 422 on the first middle gate portion 440, a second middle gate portion 450 on the channel layer 422, and a channel layer 424 on the second middle gate portion 450. In some embodiments, steps for forming the first middle gate portion 440 are similar to those mentioned above; therefore such details are omitted for brevity. In some embodiments, steps for forming the second middle gate portion 450 are similar as those mentioned above, therefore those details are also omitted for brevity. As shown in FIG. 21, the second middle gate portion 450 can include a dual-layered gate dielectric layer 452 including a SiO layer 453a and a SiN layer 453b, a second middle gate conductive layer 454, and a dual-layered gate dielectric layer 456 including a SiN layer 457a and a SiO layer 457b. The dual-layered gate dielectric layer 452 and the dual-layered gate dielectric layer 456 form a second middle gate dielectric layer. As shown in FIG. 21, the second middle gate conductive layer 454 is separated from and electrically isolated from the substrate 402, the channel layer 422 and the channel layer 424 by the second middle gate dielectric layer 452 and 456. Additionally, a top surface of the second middle gate portion 450 and a top surface of the channel layer 424 are lower than the opening of the gate trench 406, as shown in FIG. 21.

In some embodiments, step 106 and step 108 can be sequentially repeated more times to form more middle gate portions and channel layers if required. However, top surfaces of the middle gate portions and top surfaces of the channel layers are always lower than the opening of the gate trench 406.

Figure 22:
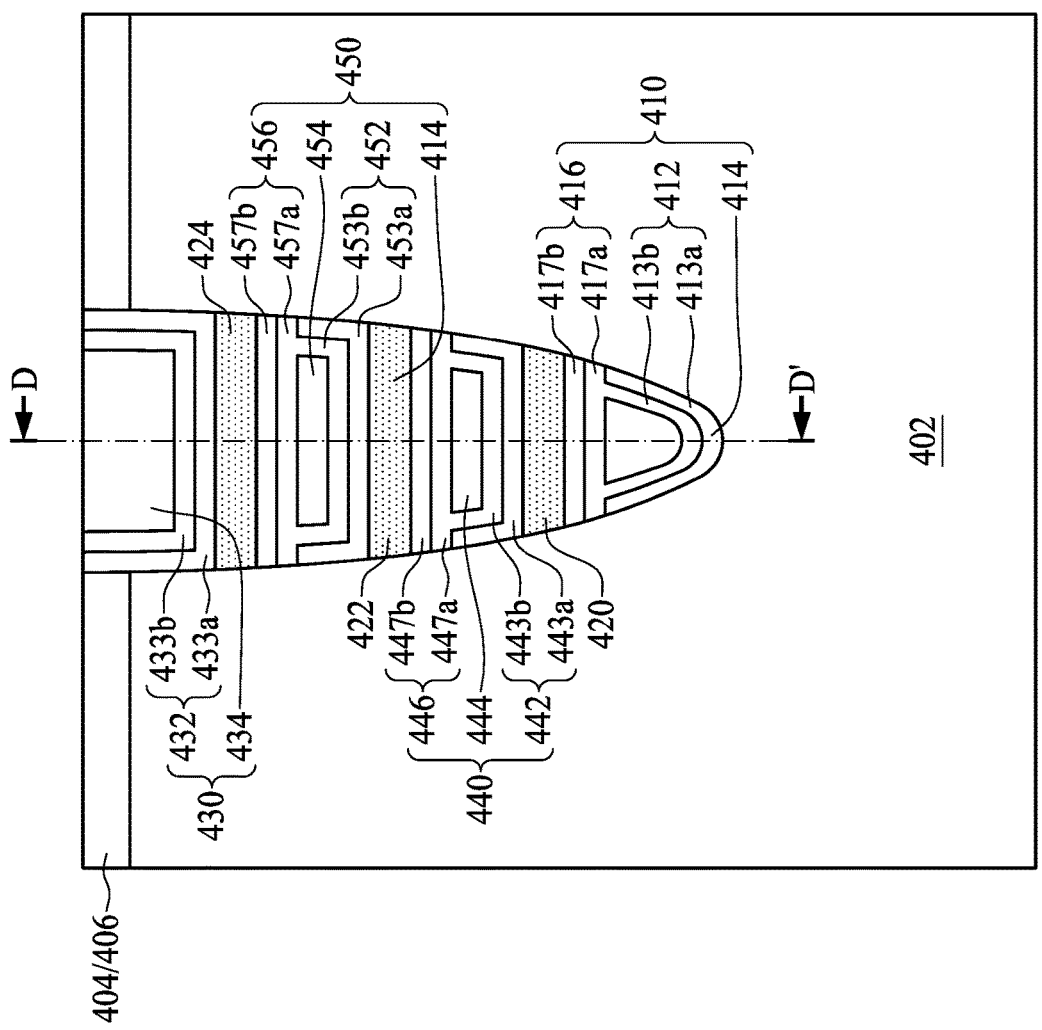

Referring to FIG. 22, next, a top gate portion 430 is formed on the channel layer 424 in the gate trench 406 according to step 110. In some embodiments, a top gate dielectric layer 432 is conformally formed in the gate trench 206. As shown in FIG. 22, the top gate dielectric layer 432 covers sidewalls of the gate trench 406 and the top err surface of the channel layer 424. In some embodiments, the top gate dielectric layer 432 can be a dual-layered gate dielectric layer including a SiO layer 433a and a SiN layer 433b, but the disclosure is not limited thereto. Next, a top gate conductive layer 434 is formed on the top gate dielectric layer 432 in the gate trench 406. Accordingly, the gate trench 406 is filled with the top gate conductive layer 434. Next, a portion of the top gate dielectric layer 432 and a portion of the top gate conductive layer 434 are removed to form the top gate portion 430 in the gate trench 406 and to expose a surface of the substrate 402, as shown in FIG. 22. In some embodiments, a source/drain region 406 can be formed in the substrate 402 as shown in FIG. 22.

Figure 23:
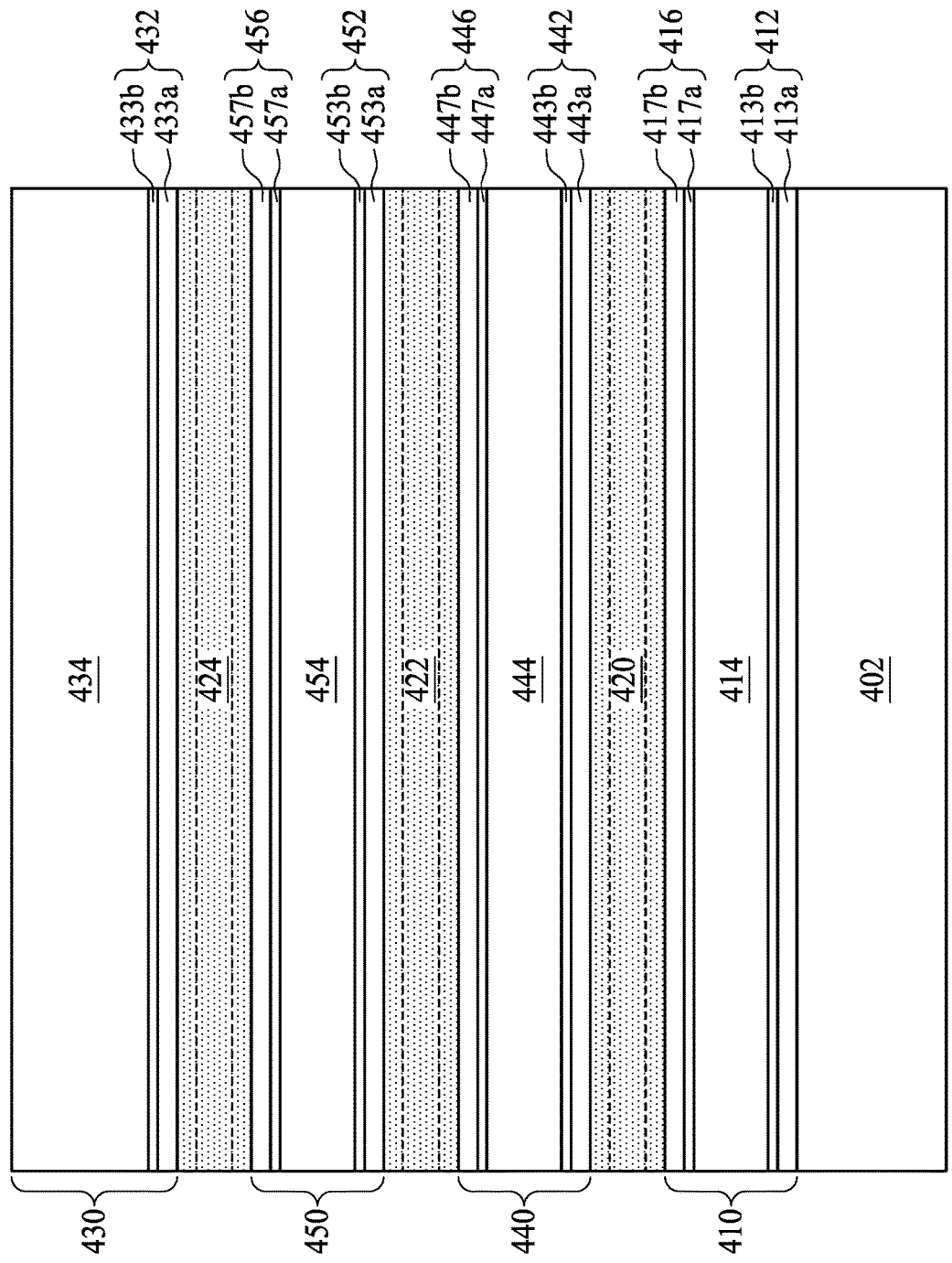
FIG. 23 is a schematic diagram illustrating the semiconductor structure as seen in a cross-sectional view taken along line D-D' of FIG. 22.

Please refer to FIGS. 22 and 23, wherein FIG. 23 is a schematic diagram illustrating the semiconductor structure 400 as seen in a cross-sectional view taken along line D-D' of FIG. 22. According to the method for preparing the semiconductor structure 10, the semiconductor structure 400 is provided. The semiconductor structure 400 includes the substrate 402, the bottom gate portion 410 disposed in the substrate 402, the top gate portion 430 stacked over the bottom gate portion 410, the channel layer 420 sandwiched between the top gate portion 430 and the bottom gate portion 410, and a source/drain region 406 disposed in the substrate 402 at two opposite sides of the top gate portion 430. Further, at least one channel layer 422 is disposed between the channel layer 420 and the top gate portion 430, and at least one middle gate portion 440 is sandwiched between the channel layer 420 and the channel layer 422, as shown in FIG. 23. In some embodiments, a plurality of middle gate portions and a plurality of channel layers can be formed. In those embodiments, all the gate portions and all the channel layers are alternately stacked over the substrate 402, as shown in FIG. 23.

Referring to FIG. 22, a width of the top gate portion 430 is greater than a width of the channel layer 424. The width of the channel layer 424 is greater than a width of the second middle gate portion 450. The width of the second middle gate portion 450 is greater than a width of the channel layer 422. The width of the channel layer 422 is greater than a width of first middle gate portion 440. The width of first middle gate portion 440 is greater than a width of the channel layer 420. The width of the channel layer 420 is greater than a width of the bottom gate portion 410. The top gate portion 430 overlaps the entire channel layer 424, and the channel layer 424 overlaps the entire second middle gate portion 450. The second middle gate portion 450 overlaps the entire channel layer 422, and the channel layer 422 overlaps the entire first middle gate portion 440. The first middle gate portion 440 overlaps the entire channel layer 420, and the channel layer 420 overlaps the entire bottom gate portion 410. In some embodiments, the bottom gate portion 410, the middle gate portion 440 and 450, and the top gate portion 430 are electrically connected, though the feature is not shown.

Figure 24:
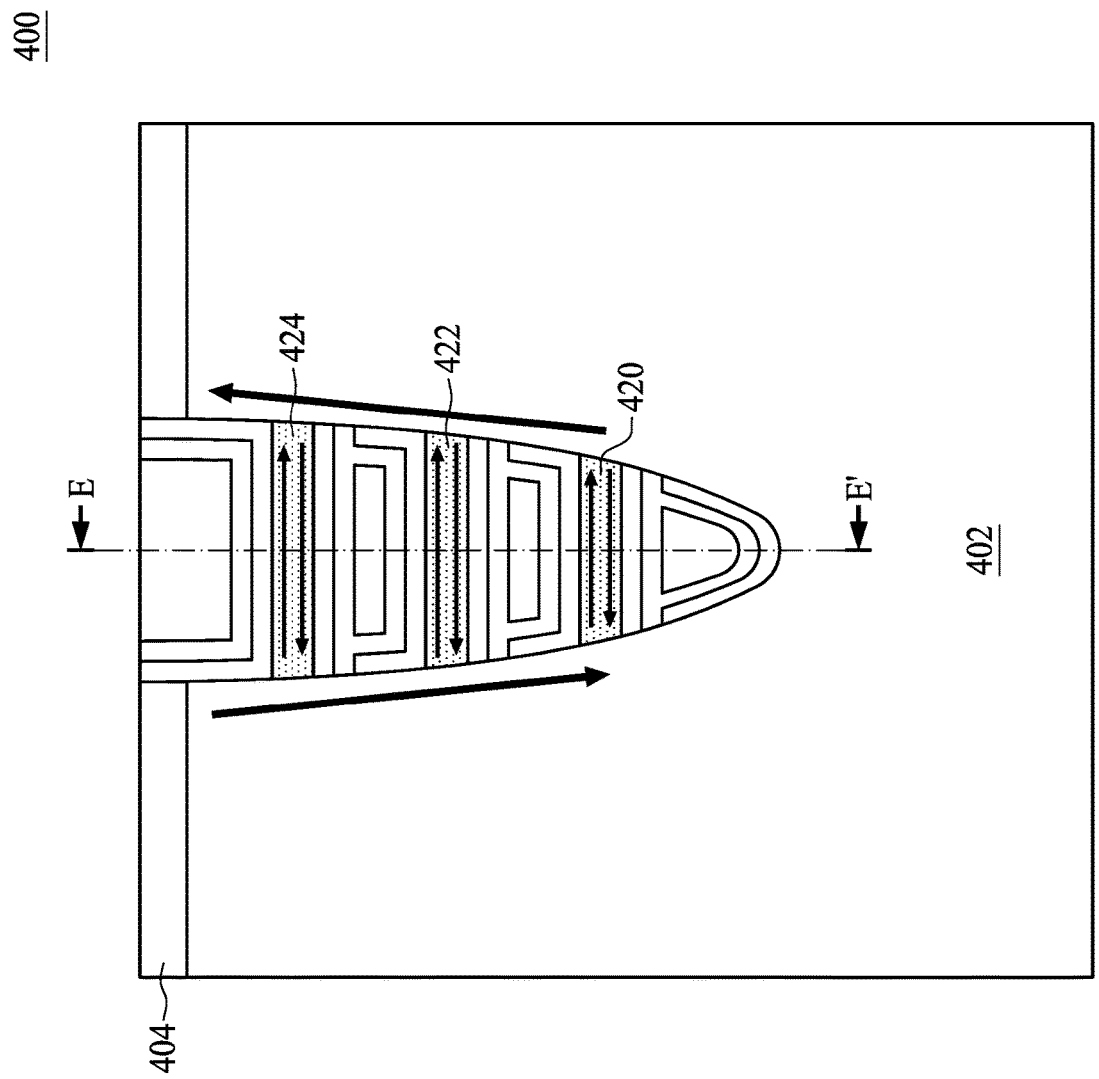
FIG. 24 is a schematic diagram illustrating the semiconductor structure in operation in accordance with some embodiments of the present disclosure.
Figure 25:
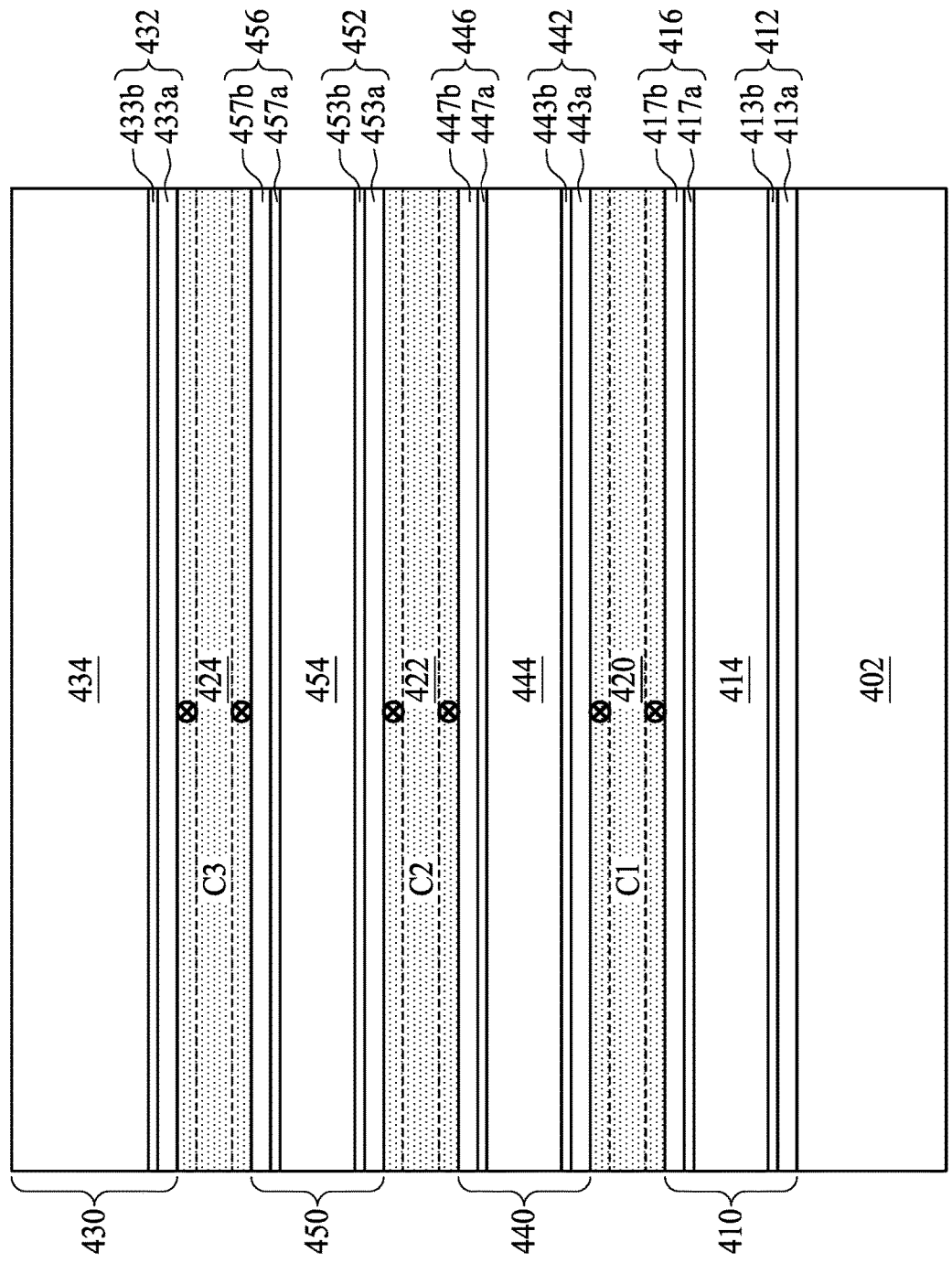
FIG. 25 is a schematic diagram illustrating the semiconductor structure as seen in a cross-sectional view taken along line E-E' of FIG. 24.

Please refer to FIGS. 24 and 25, wherein FIG. 24 is a schematic diagram illustrating the semiconductor structure 400 in operation, and FIG. 25 is a schematic diagram illustrating the semiconductor structure 400 as seen in a cross-sectional view taken along line E-E' of FIG. 24. In some embodiments, the semiconductor structure 400 is a multi-gate structure. A dual-channel region C1 is generated in the channel layer 420, a dual-channel region C2 is generated in the channel layer 422, and a dual-channel region C3 is generated in the channel layer 424 all simultaneously, as shown in FIGS. 24 and 25. By applying a single voltage to the multi-gate structure, dual channel regions C1, C2 and C3 are generated individually and simultaneously in the channel layers 420, 422 and 424. Accordingly, gate control ability is improved. Further, since the channel layers 420, 422 and 424 are fully depleted and shortcuts are thereby provided between the source/drain region 406, $I_{dsat}$ is increase. Further, $I_{doff}$ is reduced due to the fully depleted channel layers 420, 422 and 424. As a result, subthreshold slope and on-off ratio are increased.

In some embodiments, the semiconductor structure 400 can include a deeper gate trench 406. Thus, the bottom gate portion 410 is formed more deeply in the substrate 402. By introducing the deeper bottom gate portion 410, leakage current is further reduced. However, the channel layers 420, 422 and 424 still serve as shortcuts between the source/drain region 406. Therefore, the leakage current is reduced without affecting $I_{dsat}$.

Figure 26:
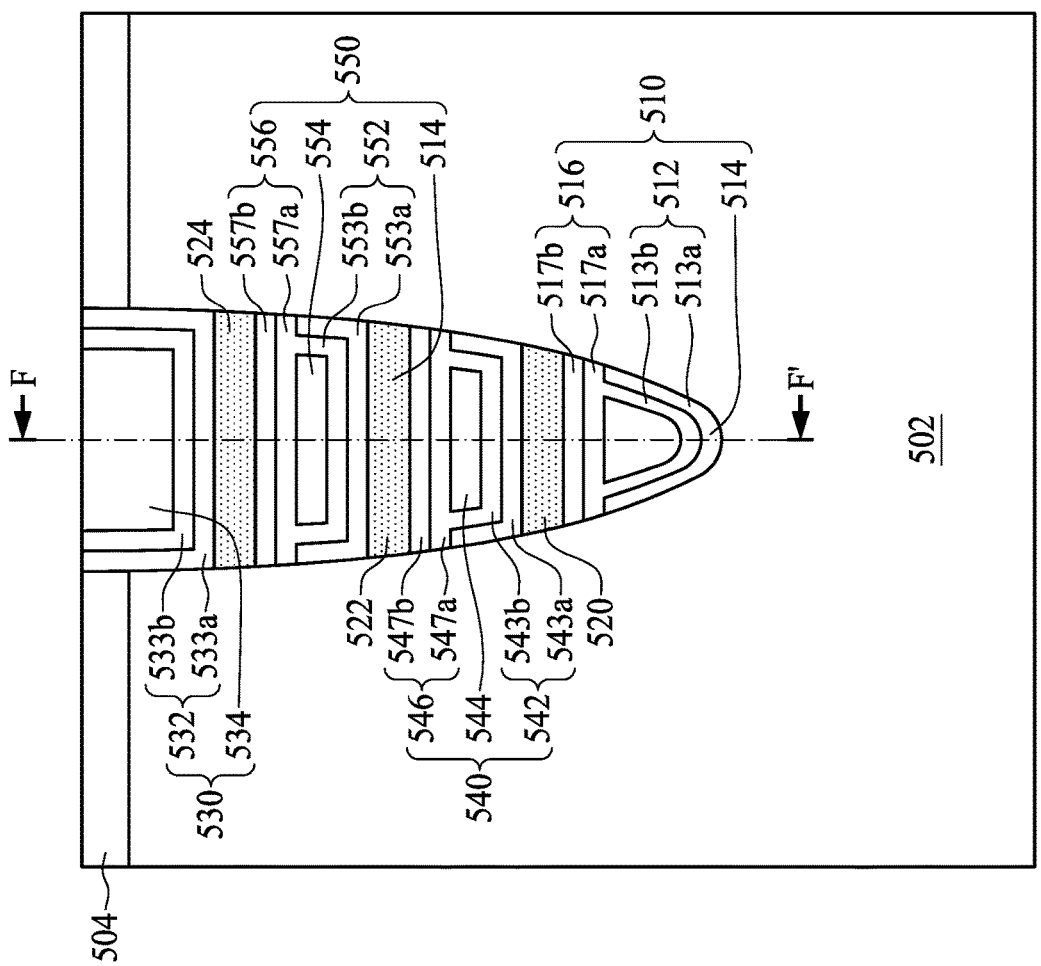
FIG. 26 is a schematic diagram illustrating a semiconductor structure in accordance with some embodiments of the present disclosure.
Figure 27:
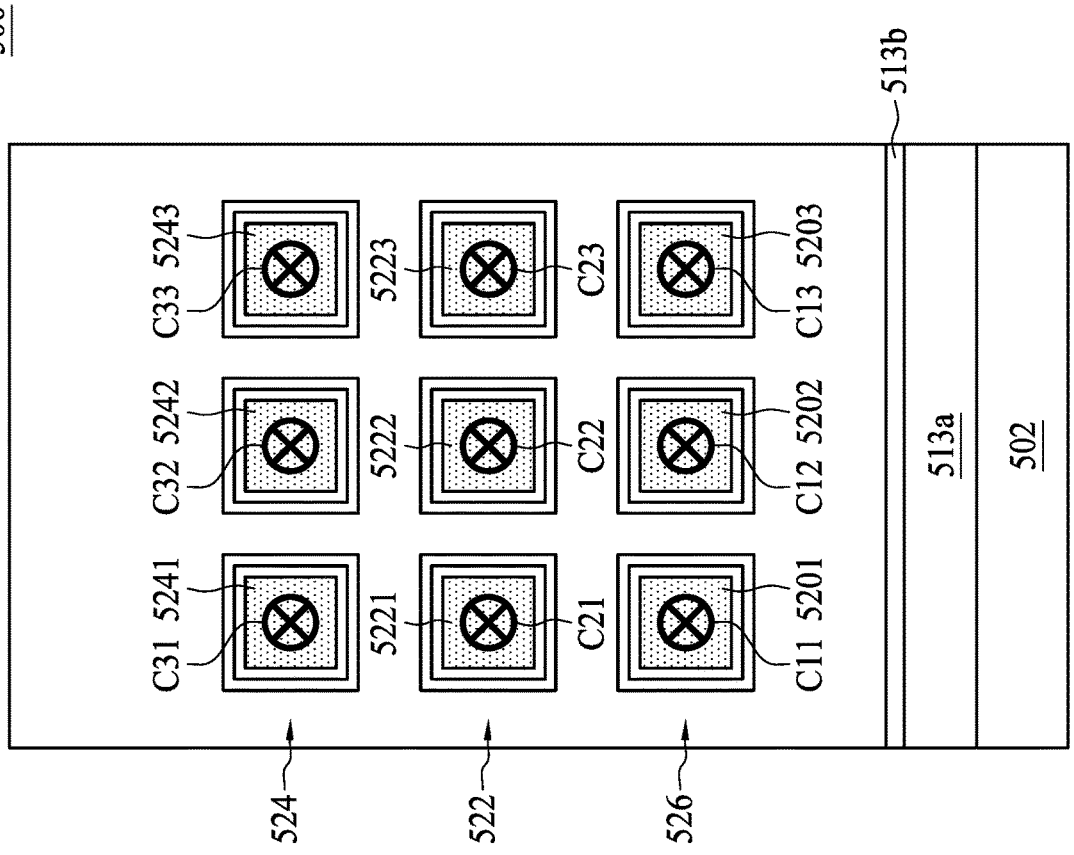
FIG. 27 is a schematic diagram illustrating the semiconductor structure as seen in a cross-sectional view taken along line F-F' of FIG. 26.

Please refer to FIGS. 26 through 27, wherein FIG. 26 is a schematic diagram illustrating a semiconductor structure 500 in accordance with some embodiments of the present disclosure, and FIG. 27 is a schematic diagram illustrating the semiconductor structure 500 as seen in a cross-sectional view taken along line F-F' of FIG. 26. It should be noted that similar elements in FIGS. 22 through 23 and FIGS. 26 through 27 can be formed by similar steps; therefore, such details are omitted in the interest of brevity. In some embodiments, step 102 is performed to provide a substrate 502. Step 104 is performed to form at least one gate trench (not shown) in the substrate 502. Step 106 is performed to form a bottom gate portion 510 in the gate trench. In some embodiments, a top surface of the bottom gate portion 510 is lower than an opening of the gate trench or a surface of the substrate 502. Next, step 108 is performed to form a channel layer 520 on the bottom gate portion 510 in the gate trench. In some embodiments, step 108 further includes the following steps. In some embodiments, the channel layer 520 is patterned to form a plurality of nanowires 5201, 5202, 5203, . . . , 520n. As mentioned above, steps 106 and step 108 can be repeatedly performed if required. Therefore, a plurality of middle gate portions 540 and 550 are formed, and a plurality of channel layers 522 and 524 are formed. In some embodiments, the channel layer 522 is patterned to form a plurality of nanowires 5221, 5222, 5223, . . . , 522n, . . . . In some embodiments, the channel layer 524 is patterned to form a plurality of nanowires 5241, 5242, 5243, . . . , 524n . . . . The gate portion underlying the channel layers can be partially removed and the gate portion overlying the channel layers are then formed. Accordingly, the middle gate portion 540 can surround the nanowires 5201, 5202, 5203, . . . , 520n . . . , and the middle gate portion 550 can surround the nanowires 5221, 5222, 5223, . . . 522n.

Next, step 110 is performed to form the top gate portion 530, as shown in FIG. 26. The top gate portion 530 includes gate dielectric layer 532 and gate conductive layer 534. As shown in FIGS. 16 and 17, the top gate portion 320 can surround the nanowires 5241, 5242, 5343, . . . 534n. In some embodiments, an anneal process is performed after patterning the channel layers 520, 522 and 524, such that the nanowires are rounded.

According to the method for preparing the semiconductor structure 10, the semiconductor structure 500 is provided, as shown in FIGS. 26 and 27. Further, the channel layer 520 of the semiconductor structure 500 includes the nanowires 5201, 5202, 5203, . . . , 520n which are laterally arranged. The channel layer 522 of the semiconductor structure 500 includes the nanowires 5221, 5222, 5223, . . . , 522n which are laterally arranged. The channel layer 524 of the semiconductor structure 500 includes the nanowires 5241, 5242, 5243, . . . , 524n which are laterally arranged. In some embodiments, the nanowires are vertically aligned with each other, as shown in FIG. 27, but the disclosure is not limited thereto. Further, the top gate portion 530, the middle gate portions 540 and 550, and the bottom gate portion 510 may be physically and electrically connected to each other, and thus the nanowires are embedded in and surrounded by the top gate portion 530, the middle gate portions 540 and 550, and the bottom gate portion 510, as shown in FIGS. 26 and 27. However, the nanowires are separated from and electrically isolated from the top gate portion 530, the middle gate portions 540 and 550, and the bottom gate portion 510.

Please refer to FIG. 27. A plurality of channel regions C11, C12, C13, . . . , C1n are simultaneously generated in the nanowires 5201, 5202, 5203, . . . , 520n. A plurality of channel regions C21, C22, C23, . . . , C2n are simultaneously generated in the nanowires 5221, 5222, 5223, . . . , 522n. A plurality of channel regions C31, C32, C33, . . . , C3n are simultaneously generated in the nanowires 5241, 5242, 5243, . . . , 524n. In other words, the semiconductor structure 500 is a multiple GAA structure. By applying voltage to the multiple GAA structure, the channel regions are generated individually and simultaneously in the nanowires. Accordingly, gate control ability is improved. Further, since the channel layers 520, 522 and 524 are fully depleted and shortcuts are thereby provided between the source/drain region 506, $I_{dsat}$ is increased. Further, $I_{doff}$ is reduced due to the fully depleted channel layers 520, 522 and 524. As a result, subthreshold slope and on-off ratio are improved.

In the present disclosure, a method for preparing the semiconductor structure 10 is provided. In some embodiments, by forming the bottom gate portion 210, the top gate portion 230 and the channel layer 220 sandwiched therebetween, a dual-channel region is formed under the single voltage during operation. In some embodiments, by forming the nanowires surrounded by the top gate portion 330 and the bottom gate portion 310, channel regions are formed in the nanowires under the single voltage during operation. Consequently, gate control ability is improved due to the dual gate structure or GAA structure. Further, $I_{dsat}$ is increased and $I_{doff}$ is reduced due to the fully depleted channel layer. Further, since the channel layer 220 is sandwiched between the bottom gate portion 210 and the top gate portion 230, the bottom gate portion 210 can be embedded more deeply in the substrate 202 to reduce current leakage without increasing the channel length. Accordingly, subthreshold slope and, on-off ratio are both increased.

In contrast, with a comparative semiconductor structure, the channel length is limited by the depth of the gate structure, and thus the semiconductor structure suffers from lower $I_{dsat}$ and higher current leakage.

One aspect of the present disclosure provides a semiconductor structure. The semiconductor structure includes a substrate, a bottom gate portion disposed in the substrate, a top gate portion stacked over the bottom gate portion, a first channel layer sandwiched between the top gate portion and the bottom gate portion, and a source/drain region disposed in the substrate at two opposite sides of the top gate portion.

Another aspect of the present disclosure provides a method for preparing a semiconductor structure. The method includes the following steps. A substrate is provided. At least one gate trench is formed in the substrate. A bottom gate portion is formed in the gate trench. In some embodiments, a top surface of the bottom gate portion is lower than an opening of the gate trench. Next, a channel layer is formed on the bottom gate portion in the gate trench. In some embodiments, a top surface of the channel layer is lower than the opening of the gate trench. Next, a top gate portion is formed over the channel layer in the gate trench.

Although the present disclosure and its advantages have been described in detail, it should be understood that various changes, substitutions and alterations can be made herein without departing from the spirit and scope of the disclosure as defined by the appended claims. For example, man of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor structure comprising:
a substrate;
a bottom gate portion disposed in the substrate; a top gate portion stacked over the bottom gate portion;
a first channel layer disposed in the substrate and sandwiched between the top gate portion and the bottom gate portion, wherein two sides of the first channel layer contacted with the substrate; and
a source/drain region disposed in the substrate at two opposite sides of the top gate portion, wherein the source/drain region includes a top surface and a bottom surface, and the source/drain region is sandwiched between the top surface and the bottom surface;
wherein the bottom surface of the source/drain region is higher than or substantially level with a bottom surface of the top gate portion;
wherein the bottom surface of the source/drain region is directly coupled to the substrate which surrounds the bottom gate portion, the first channel layer and a part of the top gate portion;
wherein the top surface of the source/drain region is coplanar with a top surface of the top gate portion.

2. The semiconductor structure of claim 1, wherein the bottom gate portion comprises a bottom gate conductive layer and a bottom gate dielectric layer, and the bottom gate conductive layer is separated from the substrate and the first channel layer by the bottom gate dielectric layer.

3. The semiconductor structure of claim 1, wherein the top gate portion comprises a top gate conductive layer and a top gate dielectric layer, and the top gate conductive layer is separated from the substrate and the first channel layer by the top gate dielectric layer.

4. The semiconductor memory of claim 1, wherein a width of the first channel layer is equal to or less than a width of the top gate portion, and a width of the bottom gate portion is equal to or less than the width of the first channel layer.

5. The semiconductor structure of claim 4, wherein the top gate portion overlaps the entire first channel layer, and the first channel layer overlaps the entire bottom gate portion.

6. The semiconductor structure of claim 1, wherein the first channel layer comprises an epitaxial semiconductor material.

7. The semiconductor structure of claim 1, wherein the bottom gate portion and the top gate portion are electrically connected.

8. The semiconductor structure of claim 1, wherein the first channel layer comprises a plurality of nanowires.

9. The semiconductor structure of claim 1, further comprising:

at least one second channel layer disposed between the first channel layer and the top gate portion; and at least one middle gate portion sandwiched between the first channel layer and the second channel layer.

10. The semiconductor structure of claim 9, wherein the bottom gate portion, the top gate portion, and the middle gate portion are electrically connected.

11. The semiconductor structure of claim 9, wherein the middle gate portion comprises a middle gate dielectric layer and a middle gate conductive layer, and the middle gate conductive layer is separated from the substrate, the first channel layer and the second channel layer by the middle gate dielectric layer.

12. The semiconductor structure of claim 9, wherein a width of the top gate portion is greater than a width of the middle gate portion, and the width of the middle gate portion is greater than a width of the bottom gate portion.

13. The semiconductor structure of claim 12, wherein the middle gate portion overlaps the entire bottom gate portion, and the top gate portion overlaps the entire middle gate portion.

14. The semiconductor structure of claim 9, wherein the first channel layer comprises a plurality of first nanowires, and the second channel layer comprises a plurality of second nanowires.

* * * * *